(12) United States Patent
Takata et al.

(10) Patent No.: US 10,994,951 B2
(45) Date of Patent: May 4, 2021

(54) ELECTRONIC COMPONENT HANDLER AND ELECTRONIC COMPONENT TESTER

(71) Applicant: Seiko Epson Corporation, Tokyo (JP)

(72) Inventors: Fuyumi Takata, Azumino (JP); Noriaki Kotani, Hara (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/515,081

(22) Filed: Jul. 18, 2019

(65) Prior Publication Data

US 2020/0024083 A1 Jan. 23, 2020

(30) Foreign Application Priority Data

Jul. 19, 2018 (JP) .............................. JP2018-135587

(51) Int. Cl.
*H01L 21/677* (2006.01)
*B65G 47/91* (2006.01)

(52) U.S. Cl.
CPC ........ *B65G 47/91* (2013.01); *H01L 21/67721* (2013.01); *H01L 21/67724* (2013.01); *H01L 21/67727* (2013.01)

(58) Field of Classification Search
None
See application file for complete search history.

(56) References Cited

U.S. PATENT DOCUMENTS 6,111,246 A 8/2000 Watanabe et al.

FOREIGN PATENT DOCUMENTS

| CN | 1084476 C | | 5/2002 |
|---|---|---|---|
| JP | H01-278098 A | | 11/1989 |
| JP | H09-325173 A | | 12/1997 |
| JP | 2003-167022 A | | 6/2003 |
| JP | 2003167022 A | * | 6/2003 |
| JP | 2016-148573 A | | 8/2016 |
| JP | 2016-148574 A | | 8/2016 |
| JP | 2016148573 A | * | 8/2016 |
| JP | 2016148574 A | * | 8/2016 |

(Continued)

OTHER PUBLICATIONS

TW search report dated May 18, 2020 re: Application No. 108125060, pp. 1.

*Primary Examiner* — Gerald McClain
(74) *Attorney, Agent, or Firm* — Gang Yu

(57) ABSTRACT

An electronic component handler includes an electronic component transporter transporting an electronic component in an arrangement state where a shuttle plate is arranged, the shuttle plate having a recess receiving the electronic component, a light source casting light, a light receiver receiving the light, a detector detecting presence/absence of the electronic component in the recess, and a negative pressure generator putting the recess under a negative pressure. The shuttle plate has a first flow path. The electronic component transporter has: a shuttle plate fastener having a second flow path communicated with the first flow path in the arrangement state and having the shuttle plate fixed thereto in the arrangement state, a transmission member sealing the second flow path and transmitting the light, and a driver driving the shuttle plate fastener. The negative pressure generator is coupled to the second flow path and sucks the electronic component in the recess.

10 Claims, 17 Drawing Sheets

(56) References Cited

FOREIGN PATENT DOCUMENTS

| TW | 201629513 A | 8/2016 | |
|----|-------------|--------|---|
| TW | 201703951 A | 2/2017 | |
| TW | 201712325 A | 4/2017 | |
| WO | WO-2017002369 A1 * | 1/2017 | ........... G01N 21/956 |

* cited by examiner

ELECTRONIC COMPONENT HANDLER AND ELECTRONIC COMPONENT TESTER

The present application is based on, and claims priority from, JP Application Serial Number 2018-135587, filed Jul. 19, 2018, the disclosure of which is hereby incorporated by reference herein in its entirety.

BACKGROUND

1. Technical Field

The present disclosure relates to an electronic component handler and an electronic component tester.

2. Related Art

According to the related art, an IC testing device which carries out an electrical test of an IC device is known. JP-A-9-325173 is an example of the related art. In the IC testing device disclosed in JP-A-9-325173, to test an IC device, the IC device sucked to an IC suction pad is first placed on a test tray and the IC device is subsequently released from the IC suction pad. Subsequently, the IC device is tested while being placed on the test tray. The IC testing device disclosed in JP-A-9-325173 can also detect the presence/absence of an IC device on the test tray.

However, though the IC testing device disclosed in JP-A-9-325173 can detect the presence/absence of an IC device on the test tray, an IC device cannot be stably placed on the test tray, for example, when the release of an IC device from the IC suction pad is insufficient before the detection.

SUMMARY

The present disclosure can be implemented in the following forms.

An electronic component handler according to an aspect of the present disclosure includes: an electronic component transporter transporting an electronic component in an arrangement state where a shuttle plate is arranged, the shuttle plate having a placing part where the electronic component is placed; a light irradiator casting light onto the placing part; a light receiver receiving the light and outputting a signal; a detector detecting presence/absence of the electronic component placed in the placing part, based on the signal; and a negative pressure generator putting the placing part under a negative pressure which is a lower pressure than an atmospheric pressure. The shuttle plate has a first flow path which opens in and penetrates the placing part and where a fluid and the light pass. The electronic component transporter has: a shuttle plate fastener provided with a second flow path which communicates with the first flow path and is coupled to the negative pressure generator in the arrangement state and where the fluid and the light pass, the shuttle plate fastener having the shuttle plate fixed thereto in the arrangement state; a transmission member which is provided in the shuttle plate fastener, which is arranged on the other side of the first flow path from the placing part in the arrangement state and thus seals the second flow path, and through which the light is transmitted; and a driver driving the shuttle plate fastener. When the negative pressure generator puts the placing part under the negative pressure, the electronic component is sucked to the placing part.

An electronic component tester according to another aspect of the present disclosure includes: an electronic component transporter transporting an electronic component in an arrangement state where a shuttle plate is arranged, the shuttle plate having a placing part where the electronic component is placed; a light irradiator casting light onto the placing part; a light receiver receiving the light and outputting a signal; a detector detecting presence/absence of the electronic component placed in the placing part, based on the signal; a negative pressure generator putting the placing part under a negative pressure which is a lower pressure than an atmospheric pressure; and a tester testing the electronic component. The shuttle plate has a first flow path which opens in and penetrates the placing part and where a fluid and the light pass. The electronic component transporter has: a shuttle plate fastener provided with a second flow path which communicates with the first flow path and is coupled to the negative pressure generator in the arrangement state and where the fluid and the light pass, the shuttle plate fastener having the shuttle plate fixed thereto in the arrangement state; a transmission member which is provided in the shuttle plate fastener, which is arranged on the other side of the first flow path from the placing part in the arrangement state and thus seals the second flow path, and through which the light is transmitted; and a driver driving the shuttle plate fastener. When the negative pressure generator puts the placing part under the negative pressure, the electronic component is sucked to the placing part.

DESCRIPTION OF EXEMPLARY EMBODIMENTS

Hereinafter, the electronic component handler and the electronic component tester according to the present disclosure will be described in detail, based on exemplary embodiments shown in the accompanying drawings.

First Embodiment

Figure 1:
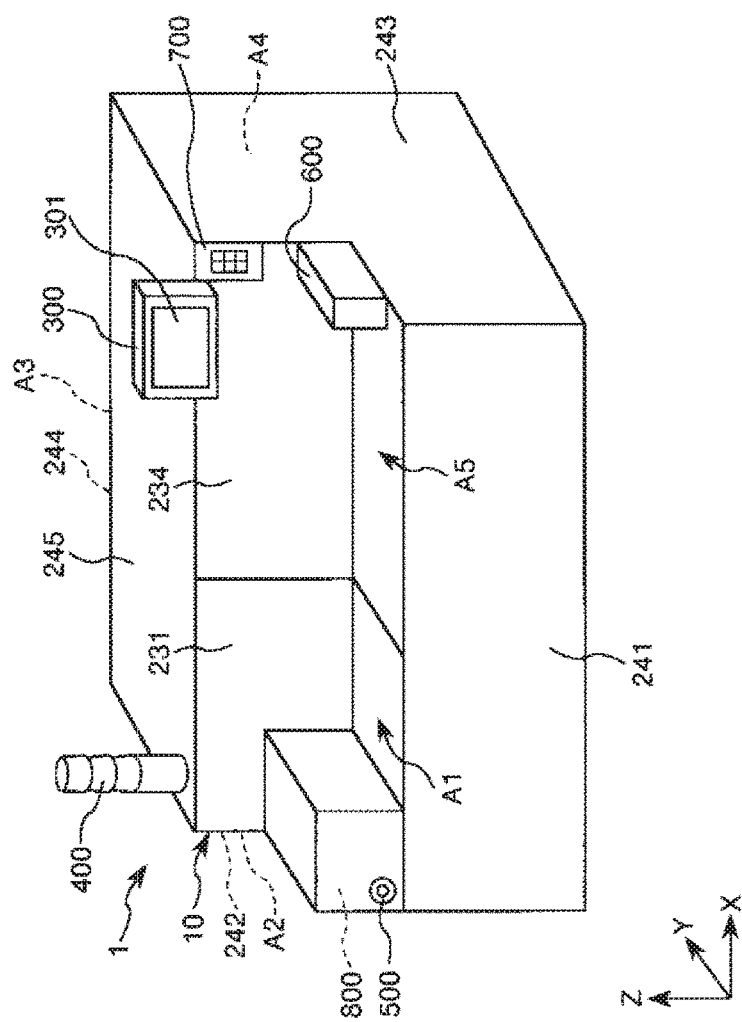
FIG. 1 is a schematic perspective view showing a first embodiment of the electronic component tester according to the present disclosure, as viewed from the front side.

A first embodiment of the electronic component handler and the electronic component tester according to the present disclosure will now be described with reference to FIGS. 1 to 14. In the description below, for the sake of convenience of the description, three axes orthogonal to each other are defined as X-axis, Y-axis, and Z-axis, as shown in FIG. 1. An XY plane including the X-axis and the Y-axis is horizontal. The Z-axis is vertical. An axis parallel to the X-axis is also referred to as "X-axis (first axis)". An axis parallel to the Y-axis is also referred to as "Y-axis (second axis)". An axis parallel to the Z-axis is also referred to as "Z-axis (third axis)". On each of these axes, the side pointed by an arrow is referred to as "positive". The opposite side is referred to as "negative". The term "horizontal" in this description is not limited to complete horizontality and includes a slightly tilted state from horizontal (for example, by less than ±5° or so), provided that the transport of an electronic component is not obstructed. The term "vertical" in this description is not limited to complete verticality and includes a slightly tilted state from vertical (for example, by less than ±5° or so), provided that the transport of an electronic component is not obstructed. The upper side in FIGS. 1 and 3 to 14 (the same applies to FIGS. 15 to 19), that is, the positive side of the Z-axis may be referred to as "up" or "upper". The lower side, that is, the negative side of the Z-axis, may be referred to as "down" or "lower".

An electronic component handler 10 according to the present disclosure is an electronic component handler having the appearance shown in FIG. 1. As shown in FIGS. 7 to 14, the electronic component handler 10 includes: an electronic component transporter 26 transporting an IC device 90 (electronic component) in an arrangement state where a device collector 18 as a shuttle plate is arranged, the device collector 18 having a placing part 181 where the IC device 90 as an electronic component is placed (the state is hereinafter simply referred to as "arrangement state"; a light irradiator 271 casting light LB27 onto the placing part 181; a light receiver 272 receiving the light LB27 from the light irradiator 271 and outputting a signal; a controller 800 (see FIG. 2) functioning as a detector detecting the presence/absence of the IC device 90 placed in the placing part 181 based on the signal from the light receiver 272; and a negative pressure generator 6 putting the placing part 181 under a negative pressure which is a lower pressure than the atmospheric pressure.

The device collector 18 (shuttle plate) has a first flow path 182 which opens in and penetrates the placing part 181 and where a fluid and the light LB27 pass.

The electronic component transporter 26 has: a shuttle plate fastener 3 which communicates with the first flow path 182 and is coupled to the negative pressure generator 6 in the arrangement state, which is provided with a second flow path 39 where the fluid and the light LB27 pass, and to which the device collector 18 is fixed, in the arrangement state; a transmission member 4 which is provided in the shuttle plate fastener 3, which is arranged on the other side of the first flow path 182 from the placing part 181 in the arrangement state and thus seals the second flow path 39, and through which the light LB27 is transmitted; and a driver 5 driving the shuttle plate fastener 3.

When the negative pressure generator 6 puts the placing part 181 under the negative pressure, the IC device 90 is sucked to the placing part 181.

In such a configuration, the IC device 90 can be sucked by a suction force F2 and drawn to the placing part 181, as described later. Thus, the IC device 90 can be stably placed in the device collector 18.

When, for example, the negative pressure generator 6 has deteriorated with time, the action of the suction force F2 on the IC device 90 may be insufficient. In this case, the IC device 90 may not be placed in the placing part 181 due to other conditions as well, as described later. However, according to the present disclosure, after the placement of the IC device 90 in the placing part 181 is completed, the presence/absence of the IC device 90 in the placing part 181 can be detected, based on a signal from the light receiver 272. When the IC device 90 is present in the placing part 181 where the IC device 90 should be present, the next operation can be carried out. Meanwhile, when the IC device 90 is absent from the placing part 181 where the IC device 90 should be present, the operator or the like can be notified of that.

Figure 2:
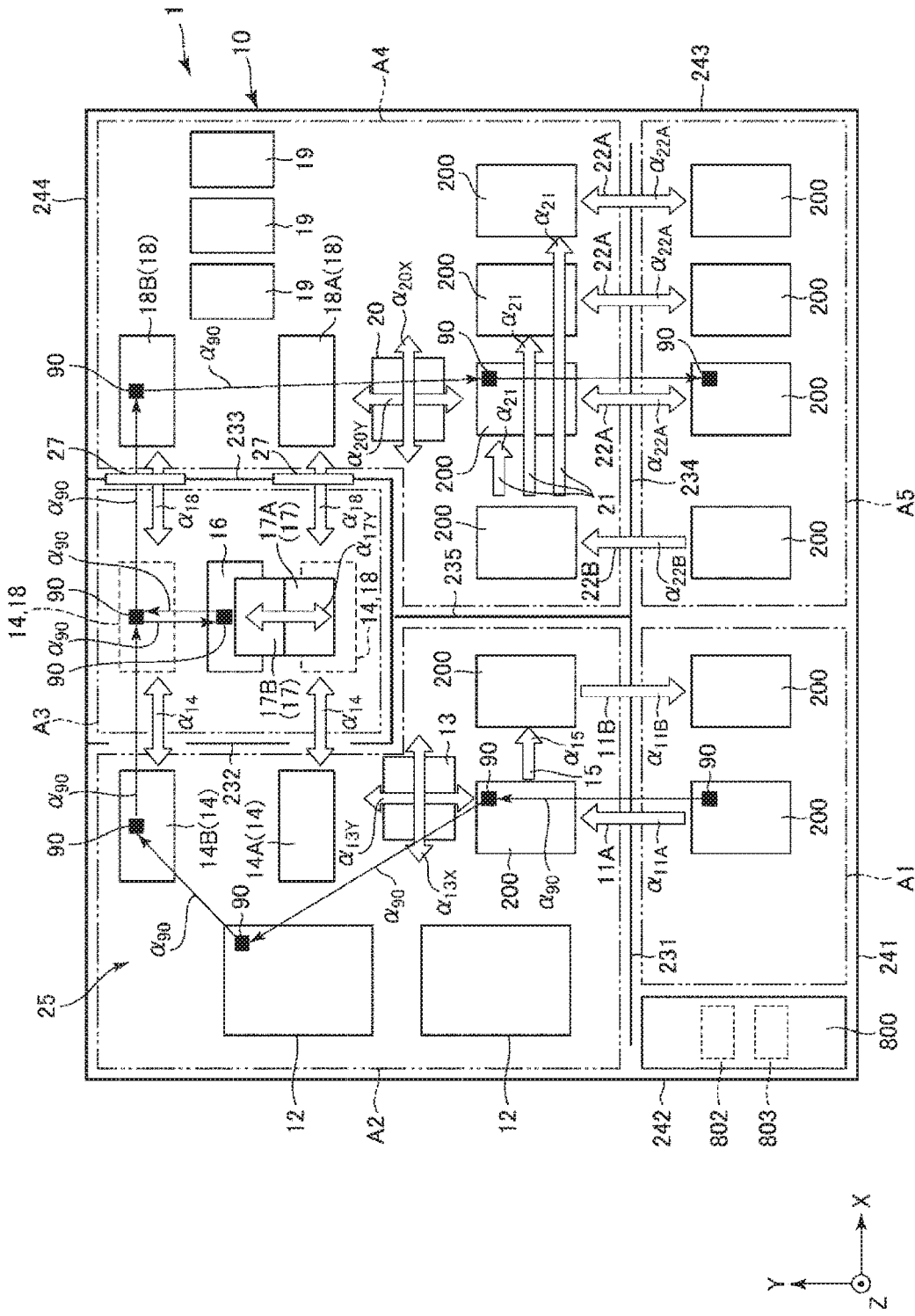
FIG. 2 is a schematic plan view showing an operation state of the electronic component tester shown in FIG. 1.

As shown in FIG. 2, an electronic component tester according to the present disclosure is a test system having the electronic component handler 10 and also having a tester 16 testing an electronic component. That is, the electronic component tester 1 includes: an electronic component transporter 26 transporting an IC device 90 (electronic component) in an arrangement state where a device collector 18 as a shuttle plate is arranged, the device collector 18 having a placing part 181 where the IC device 90 as an electronic component is placed (the state is hereinafter simply referred to as "arrangement state"; a light irradiator 271 casting light LB27 onto the placing part 181; a light receiver 272 receiving the light LB27 from the light irradiator 271 and outputting a signal; a controller 800 (see FIG. 2) functioning as a detector detecting the presence/absence of the IC device 90 placed in the placing part 181 based on the signal from the light receiver 272; a negative pressure generator 6 putting the placing part 181 under a negative pressure which is a lower pressure than the atmospheric pressure; and a tester 16 testing the IC device 90.

The device collector 18 (shuttle plate) has a first flow path 182 which opens in and penetrates the placing part 181 and where a fluid and the light LB27 pass.

The electronic component transporter 26 has: a shuttle plate fastener 3 which communicates with the first flow path 182 and is coupled to the negative pressure generator 6 in the arrangement state, which is provided with a second flow path 39 where the fluid and the light LB27 pass, and to which the device collector 18 is fixed, in the arrangement state; a transmission member 4 which is provided in the shuttle plate fastener 3, which is arranged on the other side of the first flow path 182 from the placing part 181 in the arrangement state and thus seals the second flow path 39, and through which the light LB27 is transmitted; and a driver 5 driving the shuttle plate fastener 3.

When the negative pressure generator 6 puts the placing part 181 under the negative pressure, the IC device 90 is sucked to the placing part 181.

Thus, the electronic component tester 1 having the advantages of the electronic component handler 10 is provided. Also, since the IC device 90 can be transported to the tester 16, the tester 16 can test the IC device 90. The tested IC device 90 can be transported from the tester 16.

The configuration of each part will now be described in detail.

As shown in FIGS. 1 and 2, the electronic component tester 1 having the electronic component handler 10 transports an electronic component such as an IC device, for example, a BGA (ball grid array) package, and carries out an electrical test and check of an electrical property of the electronic component in the transport process. In the description below, for the sake of convenience of the description, a case where an IC device is used as the electronic component is described as a representative example. This IC device is the "IC device 90". The IC device 90 in this embodiment is in the shape of a flat plate. The test and check of an electrical property of the electronic component is hereinafter simply referred to as "test".

The IC device may also be, for example, an "LSI (large scale integration)", "CMOS (complementary MOS)", "CCD (charge-coupled device)", "module IC" made up of a plurality of modules packaged as an IC device, "quartz crystal device", "pressure sensor", "inertial sensor (acceleration sensor)", "gyro sensor", "fingerprint sensor" or the like, as well as the foregoing IC device.

The electronic component handler 10 of the electronic component tester 1 has a tray supply area A1, a device supply area A2, a test area A3, a device collection area A4, and a tray removal area A5. These areas are marked off by a wall, as described later. The IC device 90 moves through these areas in order from the tray supply area A1 to the tray removal area A5 in the direction of an arrow α90 and is tested in the test area A3 on its way. In this way, the electronic component tester 1 has the electronic component handler 10 having a transporter 25 transporting the IC device 90 through the respective areas, the tester carrying out a test in the test area A3, and the controller 800 constituted of industrial computers. The electronic component tester 1 also has a monitor 300, a signal lamp 400, and an operation panel 700.

In this description, the term "transport" means "transporting the IC device 90 from the tray supply area A1 to the tray removal area A5". The term "on its way" includes both the state where the IC device 90 is moving and the state where the IC device 90 is stopped, in the process of transporting the IC device 90 from the tray supply area A1 to the tray removal area A5.

Of the electronic component tester 1, the side where the tray supply area A1 and the tray removal area A5 are arranged, that is, the lower side in FIG. 2, is the front side, and the side where the test area A3 is arranged, that is, the upper side in FIG. 2, is used as the back side.

In the electronic component tester 1, what is called a "change kit" replaced by the type of the IC device 90 is loaded in advance. The change kit is, for example, a temperature adjustor 12, a device supplier 14, and the device collector 18. Apart from such a change kit, what is replaced by the type of the IC device 90 is, for example, a tray 200 prepared by a user, a collection tray 19, and the tester 16.

The tray supply area A1 is a feeding part supplied with the tray 200 where a plurality of untested IC devices 90 is arranged. The tray supply area A1 can also be referred to as a loading area where a plurality of trays 200 can be stacked and loaded. In this embodiment, a plurality of recesses is arranged into a matrix on each tray 200. In each recess, one IC device 90 can be accommodated and placed.

The device supply area A2 is an area through which each of the plurality of IC devices 90 on a tray 200 transported from the tray supply area A1 is transported and supplied to the test area A3. A tray transport mechanism 11A and a tray transport mechanism 11B transporting the trays 200 one by one in the horizontal direction are provided, extending over the tray supply area A1 and the device supply area A2. The tray transport mechanism 11A is a part of the transporter 25 and can move the tray 200 together with the IC device 90 placed on the tray 200, to the positive side of the Y-axis, that is, in the direction of an arrow α11A in FIG. 2. Thus, the IC device 90 can be stably fed into the device supply area A2. The tray transport mechanism 11B can move an empty tray 200 to the negative side of the Y-axis, that is, in the direction of an arrow α11B in FIG. 2. Thus, the empty tray 200 can be moved from the device supply area A2 to the tray supply area A1.

In the device supply area A2, the temperature adjuster 12, a device transport head 13, and a tray transport mechanism 15 are provided. The temperature adjuster 12 is called a soak plate. Also, the device supplier 14 moving to and from the device supply area A2 and the test area A3 is provided.

The temperature adjuster 12 is called a "soak plate" where a plurality of IC devices 90 is placed and which can heat or cool the placed IC devices 90 all together. This soak plate can heat or cool the IC device 90 before being tested at the tester 16, and thus can adjust the IC device 90 to a suitable temperature for the test, that is, a high-temperature test or a low-temperature test or the like.

Such a temperature adjuster 12 is fixed. Thus, the temperature of the IC device 90 over the temperature adjuster 12 can be stably adjusted. The temperature adjuster 12 is grounded.

In the configuration shown in FIG. 2, two temperature adjusters 12 are arranged and fixed along the Y-axis. The IC device 90 on the tray 200 carried in from the tray supply area A1 by the tray transport mechanism 11A is transported to one of the temperature adjusters 12.

The device transport head 13 is configured to hold the IC device 90 and is supported in such a way as to be movable along the X-axis and the Y-axis in the device supply area A2 and is also supported in such a way as to be movable along the Z-axis. The device transport head 13 is also a part of the transporter 25 and can transport the IC device 90 between the tray 200 carried in from the tray supply area A1 and the temperature adjuster 12 and can also transport the IC device 90 between the temperature adjuster 12 and the device supplier 14, described later. In FIG. 2, the movement of the device transport head 13 along the X-axis is indicated by an arrow α13X and the movement of the device transport head 13 along the Y-axis is indicated by an arrow α13Y.

The device supplier 14 is what is called a "supply shuttle plate" or simply a "supply shuttle" where the IC device 90 with its temperature adjusted by the temperature adjuster 12 is placed and which can transport this IC device 90 to near the tester 16. The device supplier 14, too, can be a part of the transporter 25. The device supplier 14 has a recess where the IC device 90 is accommodated and placed.

The device supplier 14 is supported in such a way as to be able to reciprocate along the X-axis between the device supply area A2 and the test area A3, that is, along the directions of an arrow α14. Thus, the device supplier 14 can stably transport the IC device 90 from the device supply area A2 to near the tester 16 in the test area A3. After the IC device 90 is removed by a device transport head 17 in the test area A3, the device supplier 14 can return to the device supply area A2 again.

In the configuration shown in FIG. 2, two device suppliers 14 are arranged along the Y-axis. The device supplier 14 on the negative side of the Y-axis may be referred to as "device supplier 14A". The device supplier 14 on the positive side of the Y-axis may be referred to as "device supplier 14B". The IC device 90 over the temperature adjuster 12 is transported to the device supplier 14A or the device supplier 14B in the device supply area A2. Similarly to the temperature adjuster 12, the device supplier 14 is configured to be able to heat or cool the IC device 90 placed in the device supplier 14. Thus, the IC device 90 with its temperature adjusted by the temperature adjuster 12 can be transported to near the tester 16 in the test area A3, maintaining the temperature-adjusted state. Similarly to the temperature adjuster 12, the device supplier 14 is grounded.

The tray transport mechanism 15 is a mechanism which transports an empty tray 200, from which all IC devices 90 have been removed, to the positive side of the X-axis in the device supply area A2, that is, in the direction of an arrow α15. After this transport, the empty tray 200 is returned from the device supply area A2 to the tray supply area A1 by the tray transport mechanism 11B.

The test area A3 is an area where the IC device 90 is tested. In the test area A3, the tester 16 testing the IC device 90, and the device transport head 17, are provided.

The device transport head 17 is a part of the transporter 25. Similarly to the temperature adjuster 12, the device transport head 17 is configured to be able to heat or cool the IC device 90 held thereat.

Figure 7:
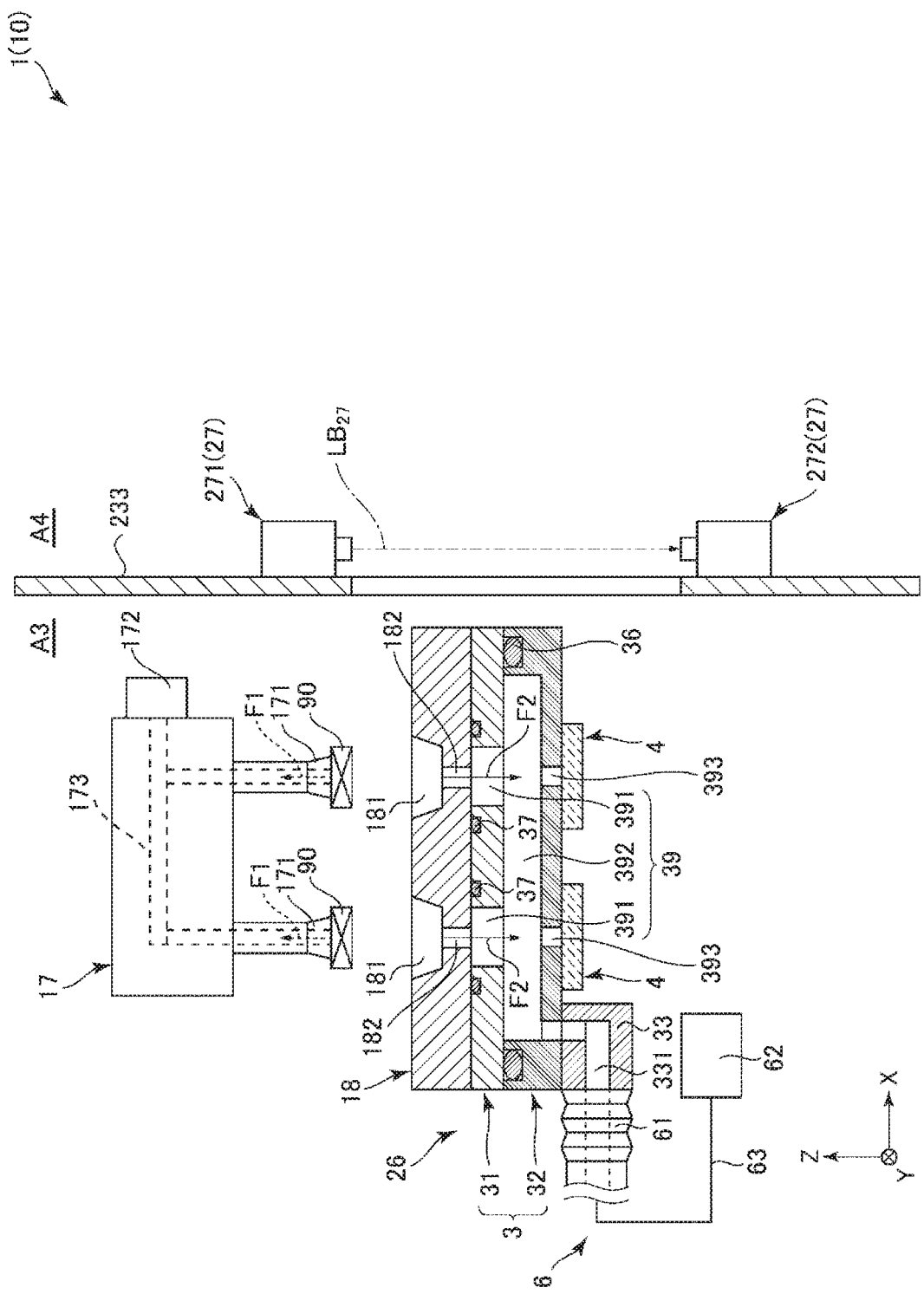
FIG. 7 is a schematic partial vertical cross-sectional view showing, step by step, a process of transporting an IC device from a test area to a collection area in the electronic component tester shown in FIG. 1.

As shown in FIG. 7, the device transport head 17 has a holder 171 which holds the IC device 90 as an electronic component by suction and places the IC device 90 (electronic component) in the placing part 181 of the device collector 18, and a suction force applier 172 which generates a suction force F1 to suck the IC device 90 at the holder 171. Thus, the IC device 90 maintained in the temperature-adjusted state can be held and the IC device 90 can be transported in the test area A3 while the temperature-adjusted state is maintained.

Although the number of holders 171 arranged in the configuration shown in FIG. 7 is two, the number of holders 171 is not limited to this and may be, for example, one, or three or more. While the two holders 171 are spaced apart along the X-axis, the form of arrangement of the holders 171 is not limited to this. The device transport head 17 is configured in such a way that the distance between the holders 171 is changeable.

The suction force applier 172 is made up of, for example, an ejector and is coupled to each holder 171 via a flow path 173. To release the IC device 90 sucked to the holder 171, the suction force applier 172 may create a vacuum break to cancel the suction force F1. This can release the IC device 90 from the holder 171.

When, for example, a printed part is formed on the surface of the IC device 90, the IC device 90 may remain sucked to the holder 171 via the printed part, regardless of whether the suction force F1 is applied or not. However, the suction force applier 172 is made up of an ejector and therefore can create a vacuum break. Thus, even when a printed part is formed on the IC device 90, the IC device 90 can be released from the holder 171.

Such a device transport head 17 is a part of a mechanism called an "index arm" supported in such a way as to be able to reciprocate along the Y-axis and the Z-axis in the test area A3. Thus, the device transport head 17 can lift the IC device 90 from the device supplier 14 carried in from the device supply area A2, and can transport and place the IC device 90 over the tester 16.

In FIG. 2, the reciprocation of the device transport head 17 along the Y-axis is indicated by an arrow α17Y. The device transport head 17 can transport the IC device 90 from the device supplier 14A to the tester 16 and transport the IC device 90 from the device supplier 14B to the tester 16, in the test area A3. While the device transport head 17 is supported in such a way as to be able to reciprocate along the Y-axis, this is not limiting. The device transport head 17 may be supported in such a way as to be able to reciprocate along the X-axis as well.

In this embodiment, as shown in FIG. 2, two device transport heads 17 are arranged along the Y-axis. The device transport head 17 on the negative side of the Y-axis may be referred to as "device transport head 17A". The device transport head 17 on the positive side of the Y-axis may be referred to as "device transport head 17B". The device transport head 17A can transport the IC device 90 from the device supplier 14A to the tester 16 in the test area A3. The device transport head 17B can transport the IC device 90 from the device supplier 14B to the tester 16 in the test area A3. Also, the device transport head 17A can transport the IC device 90 from the tester 16 to the device collector 18A in the test area A3. The device transport head 17B can transport the IC device 90 from the tester 16 to the device collector 18B in the test area A3.

The tester 16 can have the IC device 90 as an electronic component placed therein and test an electrical property of the IC device 90. A plurality of recesses is arranged into a matrix in the tester 16. In each recess, one IC device 90 is accommodated and placed. At a bottom part of each recess, the same number of probe pins as terminals of the IC device 90 is arranged in a protruding manner. When testing the IC device 90, the terminal of the IC device 90 and the probe pin are electrically coupled together, that is, come into contact with each other. This enables the testing of the IC device 90. The testing is carried out, based on a program stored in a test controller provided in a tester. Similarly to the temperature adjuster 12, the tester 16 can heat or cool the IC device 90 and adjust the IC device 90 to a suitable temperature for testing.

The device collection area A4 is an area where a plurality of IC devices 90 tested in the test area A3 and finished with the test are collected. In the device collection area A4, the collection tray 19, a device transport head 20, and a tray transport mechanism 21 are provided. Also, the device collector 18 moving to and from the test area A3 and the device collection area A4 is provided. An empty tray 200 is also prepared in the device collection area A4.

The device collector 18 is called a "collection shuttle plate" or simply a "collection shuttle" where the IC device 90 finished with the test at the tester 16 is placed and which transports the IC device 90 to the device collection area A4. The device collector 18, too, can be a part of the transporter 25.

The device collector 18 is supported in such a way as to be able to reciprocate along X-axis between the test area A3 and the device collection area A4, that is, along the directions of an arrow α18. In the configuration shown in FIG. 2, similarly to the device supplier 14, two device collectors 18 are arranged along the Y-axis. The device collector 18 on the negative side of the Y-axis may be referred to as "device collector 18A". The device collector 18 on the positive side of the Y-axis may be referred to as "device collector 18B". The IC device 90 over the tester 16 is transported to and placed in the device collector 18A or device collector 18B. The device transport head 17 can transport the IC device 90 from the tester 16 to the device collector 18A and transport the IC device 90 from the tester to the device collector 18B, in the test area A3. Similarly to the temperature adjuster 12 and the device supplier 14, the device collector 18 is grounded.

On the collection tray 19, the IC device 90 tested at the tester 16 is placed. The collection tray 19 is fixed so as not to move within the device collection area A4. Thus, even when a relatively large number of moving parts such as the device transport head 20 are arranged in the device collection area A4, the tested IC device 90 is stably placed on the collection tray 19. In the configuration shown in FIG. 2, three collection trays 19 are arranged along the X-axis.

Similarly, three empty trays 200 are arranged along the X-axis. Also, on the empty tray 200, the IC device 90 tested at the tester 16 is placed. The IC device in the device collector 18 moving into the device collection area A4 is transported to and placed on one of the collection tray 19 and the empty tray 200. Thus, the IC device 90 is classified and collected, based on the result of the test.

The device transport head 20 is supported in such a way as to be movable along the X-axis and the Y-axis in the device collection area A4 and also has a part movable along the Z-axis. The device transport head 20 is a part of the transporter 25 and can transport the IC device 90 from the device collector 18 to the collection tray 19 or the empty tray 200. In FIG. 2, the movement of the device transport head 20 along the X-axis is indicated by an arrow α20X. The movement of the device transport head 20 along the Y-axis is indicated by an arrow α20Y.

The tray transport mechanism 21 is a mechanism which transports the empty tray 200 carried in from the tray removal area A5, along the X-axis in the device collection area A4, that is, in the direction of an arrow α21. After the transport, the empty tray 200 is arranged at a position where the IC device 90 is collected. That is, this empty tray 200 can be one of the foregoing three empty trays 200.

The tray removal area A5 is a removal part where the tray 200 with a plurality of tested IC devices 90 arranged thereon is collected and removed. In the tray removal area A5, a large number of trays 200 can be stacked.

A tray transport mechanism 22A and a tray transport mechanism 22B which transport the trays 200 one by one along the Y-axis are provided, extending over the device collection area A4 and the tray removal area A5. The tray transport mechanism 22A is a part of the transporter 25 and can move the tray 200 in reciprocating motion along the Y-axis, that is, in the directions of an arrow α22A. Thus, the tested IC device 90 can be transported from the device collection area A4 to the tray removal area A5. The tray transport mechanism 22B can move the empty tray 200 for collecting the IC device 90, to the positive side of the Y-axis, that is, in the direction of an arrow α22B. Thus, the empty tray 200 can be moved from the tray removal area A5 to the device collection area A4.

The controller 800 can control, for example, working of the tray transport mechanism 11A, the tray transport mechanism 11B, the temperature adjuster 12, the device transport head 13, the device supplier 14, the tray transport mechanism 15, the tester 16, the device transport head 17, the device collector 18, the device transport head 20, the tray transport mechanism 21, the tray transport mechanism 22A, and the tray transport mechanism 22B. As shown in FIG. 2, the controller 800 in this embodiment has at least one processor 802 and at least one memory 803. The processor 802 reads, for example, a determination program, an instruction/command program or the like, as various kinds of information stored in the memory 803, and can execute a determination or command.

The controller 800 may be built in the electronic component tester 1 or may be provided in an external device such as an external computer. The external device may, for example, communicate with the electronic component tester 1 via a cable or the like, may wirelessly communicate with the electronic component tester 1, or may be connected to the electronic component tester 1 via a network such as the internet.

The operator can set and confirm an operating condition or the like of the electronic component tester 1 via the monitor 300. The monitor 300 has a display screen 301 made up of, for example, a liquid crystal screen, and is arranged in an upper part on the front side of the electronic component tester 1. As shown in FIG. 1, a mouse rest 600 where a mouse is placed is provided on the right side of the tray removal area A5 in the illustration. The mouse is used to operate a screen displayed on the monitor 300.

The operation panel 700 is arranged to the lower right from the monitor 300 in FIG. 1. The operation panel 700 is configured to instruct the electronic component tester 1 to execute a desired operation, apart from the monitor 300.

The signal lamp 400 can report the working state or the like of the electronic component tester 1 by a combination of colors of light emitted. The signal lamp 400 is arranged in an upper part of the electronic component tester 1. Also, a speaker 500 is built in the electronic component tester 1 and can report the working state or the like of the electronic component tester 1.

In the electronic component tester 1, the tray supply area A1 and the device supply area A2 are marked off from each other by a first partition wall 231. The device supply area A2 and the test area A3 are marked off from each other by a second partition wall 232. The test area A3 and the device collection area A4 are marked off from each other by a third partition wall 233. The device collection area A4 and the tray removal area A5 are marked off from each other by a fourth partition wall 234. The device supply area A2 and the device collection area A4 are marked off from each other by a fifth partition wall 235.

The electronic component tester 1 has its outermost shell covered with a cover. The cover includes, for example, a front cover 241, a side cover 242, a side cover 243, a rear cover 244, and a top cover 245.

As described above, the electronic component tester 1 is used with the device collector 18 loaded therein. As shown in FIGS. 7 to 14, the device collector 18 is a shuttle plate having the placing part 181 where the tested IC device 90 is placed. The device collector 18 is made up of a plate-like member.

The placing part 181 is made up of a recess formed on the top surface of the device collector 18. In this embodiment, two placing parts 181 along the X-axis by two placing parts 181 along the Y-axis are formed. The form of arrangement of the four placing parts 181 is not limited to this. Also, the number of placing parts 181 formed, which is four in this embodiment, is not limited to this and may be, for example, one, two, three, or five or more.

The device collector 18 (shuttle plate) has the first flow path 182 opening in the bottom side of each placing part 181 and penetrating the device collector 18 in the direction of its thickness. In this way, a plurality of first flow paths 182 is formed corresponding to the number of placing parts 181 formed. Each first flow path 182 is independently formed. A fluid such as air and the light LB27 can pass through the first flow path 182, similarly to the second flow path 39, described later.

As shown in FIG. 7 (as in FIGS. 8 to 14), the device collector 18 is supported in such a way as to be able to reciprocate along the X-axis between the test area A3 and the device collection area A4. This movement of the device collector 18 is handled by the electronic component transporter 26. The electronic component transporter 26 can transport the IC device 90 together with the device collector 18 in the arrangement state where the device collector 18 is arranged.

The electronic component transporter 26 also handles the movement of the device supplier 14. Therefore, the device supplier 14 and the device collector 18 are collectively moved in the same direction by the electronic component transporter 26.

Hereinafter, the stop position of the device collector 18 in the test area A3 is referred to as a "first position", and the stop position of the device collector 18 in the device collection area A4 is referred to as a "second position". When the device collector 18 is at the first position, the IC device 90 is placed in the placing part 181 by the device transport head 17. When the device collector 18 is at the second position, the IC device 90 is removed from the placing part 181 by the device transport head 20.

The electronic component tester 1 has an optical unit 27 arranged between the first position and the second position. The optical unit 27 is a unit used to detect the presence/absence of the IC device 90 in the device collector 18 during the movement of the device collector 18 from the first position to the second position. As shown in FIG. 2, in this embodiment, the optical unit 27 is arranged and fixed to the third partition wall 233 separating the test area A3 and the device collection area A4. The optical unit is arranged respectively on the side of the device collector 18A and on the side of the device collector 18B.

As shown in FIGS. 7 to 14, the optical unit 27 has the light irradiator 271 casting the light LB27, and the light receiver 272 that can receive the light LB27 from the light irradiator 271. Preferably, the light irradiator 271 and the light receiver 272 are fixed to the third partition wall 233 on the side of the device collection area A4.

The light irradiator 271 and the light receiver 272 are spaced apart from each other along the Z-axis, that is, along a normal line to the bottom side of the placing part 181 of the device collector 18. As for the up-down positional relation between the light irradiator 271 and the light receiver 272, the light irradiator 271 is arranged on the upper side and the light receiver 272 is arranged on the lower side in this embodiment. However, this is not limiting. The light irradiator 271 may be arranged on the lower side and the light receiver 272 may be arranged on the upper side.

The light irradiator 271 can sequentially cast the light LB27 toward each placing part 181 during the movement of the device collector 18. The light irradiator 271 is not particularly limited. For example, a laser diode or the like can be used.

The light receiver 272 can receive the light LB27 cast from the light irradiator 271. The light receiver 272 is not particularly limited. For example, a photodiode or the like can be used.

The light irradiator 271 and the light receiver 272 are electrically coupled to the controller 800.

In the electronic component tester 1, the controller 800 functions as a detector detecting the presence/absence of the IC device 90 placed in the placing part 181, based on a signal from the light receiver 272, that is, a signal generated when the light receiver 272 receives the light LB27.

As described above, the optical unit 27, that is, the light irradiator 271 and the light receiver 272 are arranged between the first position and the second position. The controller 800 (detector) can detect the presence/absence of the IC device 90 when the device collector 18 is moving together with the shuttle plate fastener 3, described later, from the first position to the second position. In this way, in the electronic component tester 1, the movement of the device collector 18 and the detection of the presence/absence of the IC device 90 in the device collector 18 can be carried out simultaneously. Thus, throughput can be improved, for example, compared with when the movement of the device collector 18 and the detection of the presence/absence of the IC device 90 in the device collector 18 are carried out at separate timings. The term "throughput" means the number of IC devices 90 transported per unit time in the electronic component tester 1.

Figure 12:
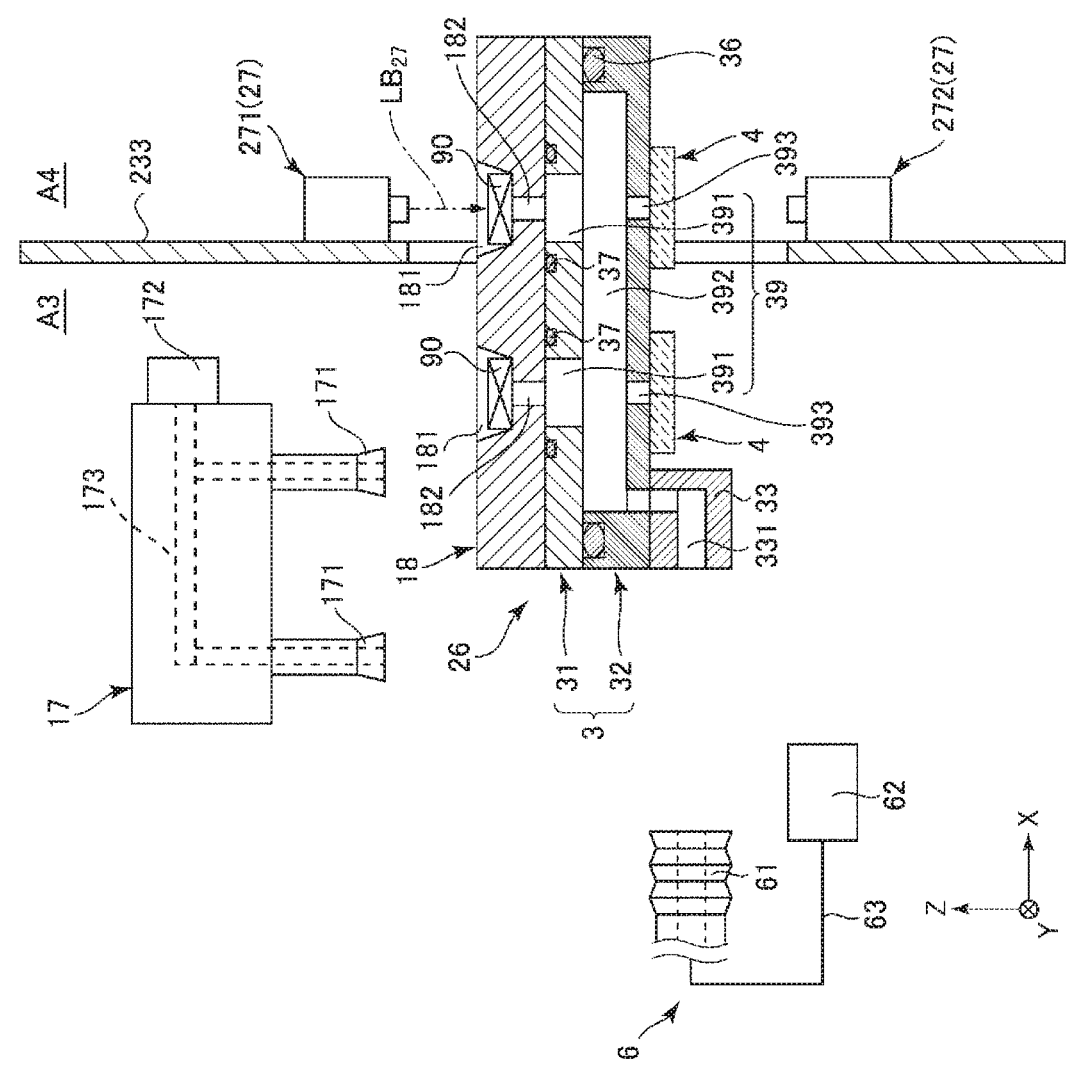
FIG. 12 is a schematic partial vertical cross-sectional view showing, step by step, the process of transporting the IC device from the test area to the collection area in the electronic component tester shown in FIG. 1.
Figure 13:
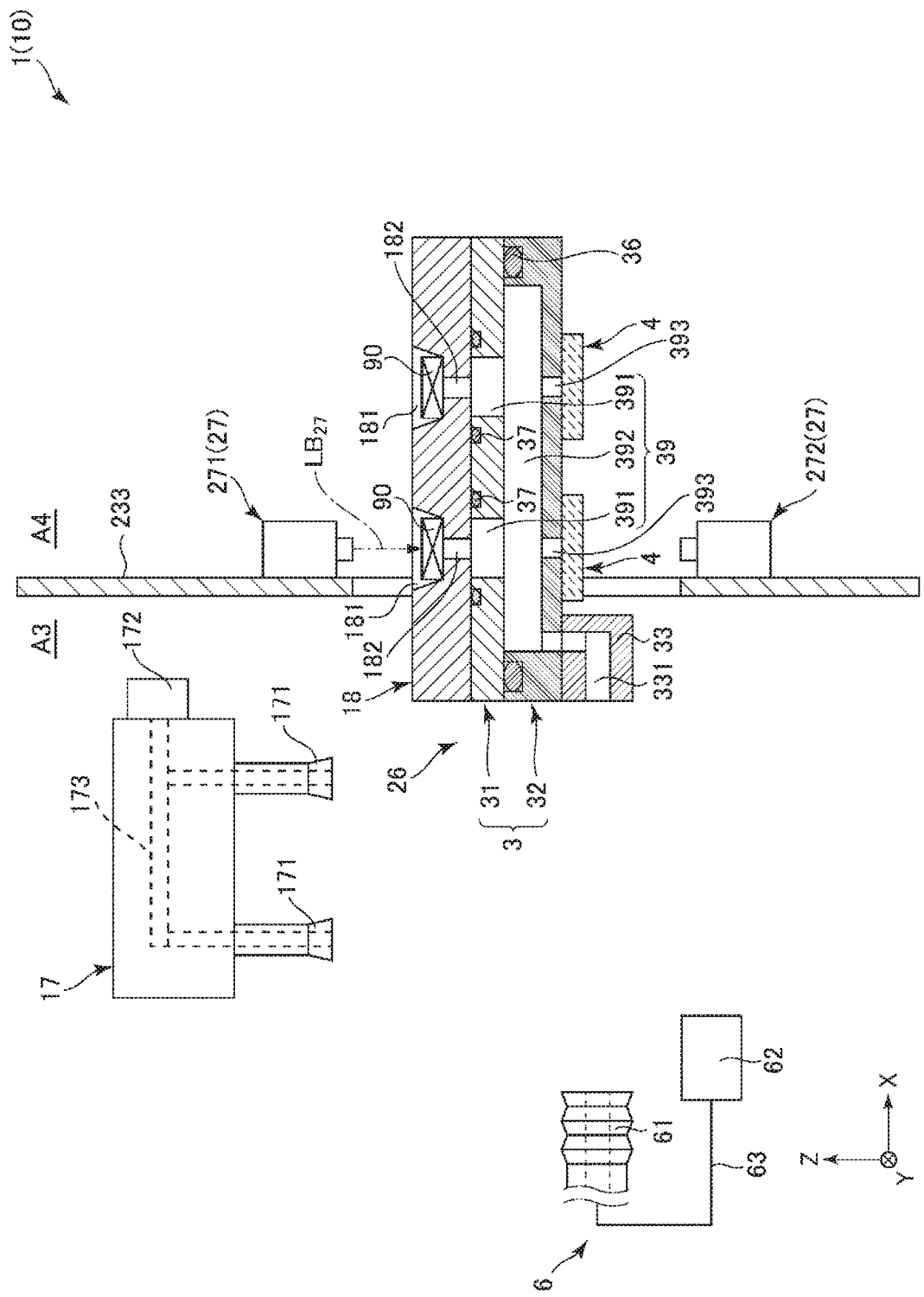
FIG. 13 is a schematic partial vertical cross-sectional view showing, step by step, the process of transporting the IC device from the test area to the collection area in the electronic component tester shown in FIG. 1.

As shown in FIGS. 12 and 13, when the IC device is placed in the placing part 181, this IC device 90 blocks the light LB27. At this time, the light receiver 272 generates no signal. Therefore, the controller 800 can determine that the IC device 90 is placed in the placing part 181.

Meanwhile, when the IC device 90 is not placed in the placing part 181, the light receiver 272 receives the light LB27. At this time, the light receiver 272 generates a signal. Therefore, the controller 800 can determine that the IC device 90 is not placed in the placing part 181.

Figure 3:
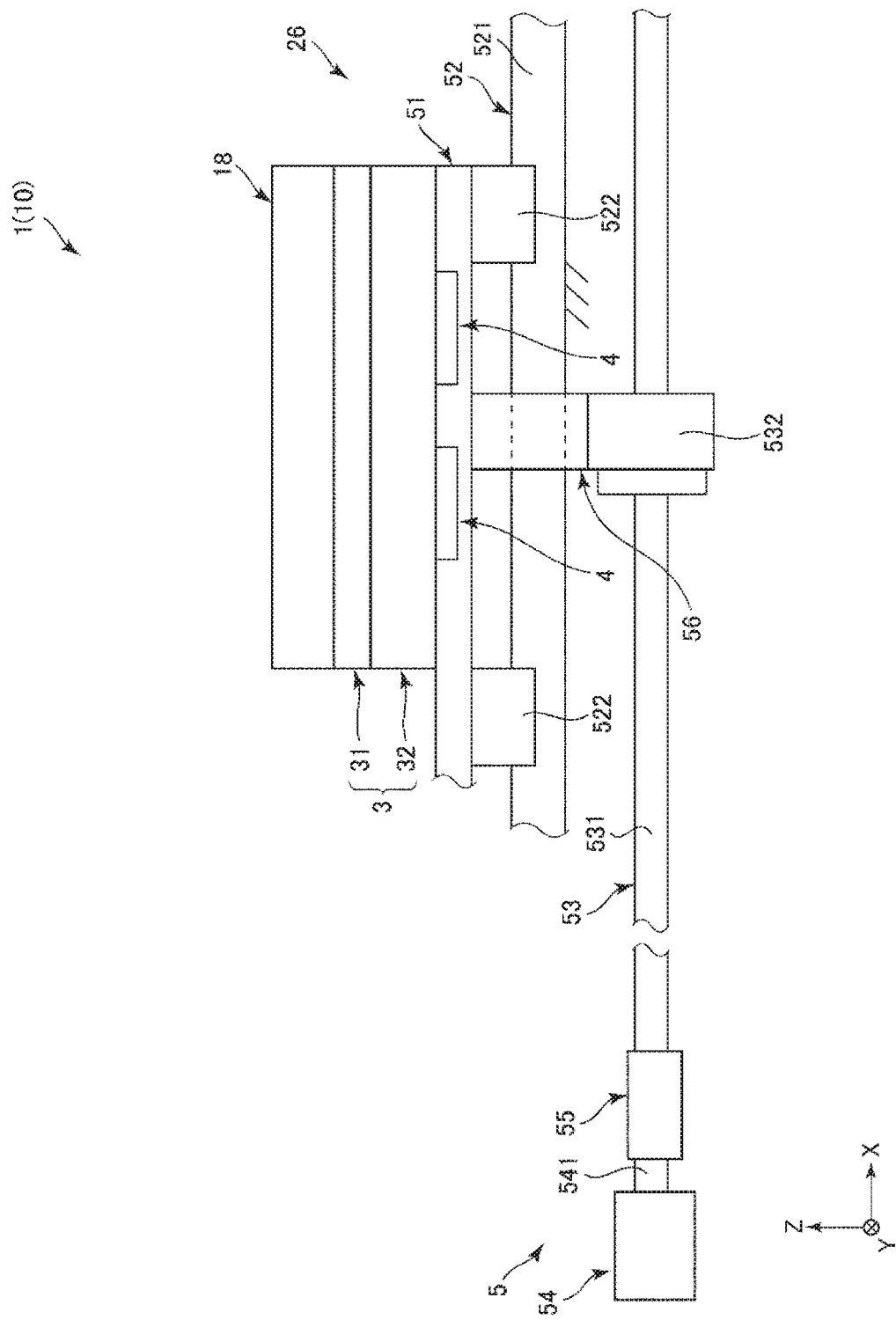
FIG. 3 is a schematic front view showing a device collector in FIG. 2.

As shown in FIG. 3, the electronic component transporter 26 has the shuttle plate fastener 3 to which the device collector 18 is fixed in the arrangement state, the transmission member 4 provided on the shuttle plate fastener 3, and the driver 5 driving the shuttle plate fastener 3.

The driver 5 has a base member 51, a linear guide 52, a ball screw 53, a motor 54, a coupling 55, and a coupling member 56.

The base member 51 is in the shape of a plate. At its top side, the shuttle plate fastener 3 is placed and fixed.

The linear guide 52 guides the base member 51 together with the shuttle plate fastener 3 along the X-axis. The linear guide 52 has a guide rail 521 extending along the X-axis, and a slider 522 sliding on the guide rail 521. The number of sliders 522 arranged is not particularly limited but may be preferably two or more, depending on the size of the base member 51.

The ball screw 53 has a screw shaft 531 extending along the X-axis, and a nut 532 meshing with the screw shaft 531. One end side of the screw shaft 531 is coupled to a rotor 541 of the motor 54 via the coupling 55. The nut 532 is coupled to the base member 51 via the coupling member 56.

In the driver 5 of such a configuration, as the motor 54 operates and the rotor 541 rotates, its rotational force is transmitted to the screw shaft 531 via the coupling 55. Thus, the nut 532 can move to the positive size on the X-axis or to the negative side of the X-axis, along the screw shaft 531. The moving force of the nut 532 is transmitted to the base member 51 via the coupling member 56. Thus, the shuttle plate fastener 3 can be driven in such a way that the device collector 18 over the shuttle plate fastener 3 moves to the positive side of the X-axis or to the negative side of the X-axis. Also, the linear guide 52 enables the device collector 18 to move stably and smoothly.

The configuration of the driver 5 is not limited to the configuration shown in FIG. 3. For example, a pulley and a timing belt laid around the pulley may be provided instead of the ball screw 53.

To the shuttle plate fastener 3, the device collector 18 is fixed in the arrangement state. Depending on the type of the IC device 90, the device collector 18 in the arrangement state may need to be replaced. In this case, the shuttle plate fastener 3 cancels the fixing of the device collector 18, resulting in a removal state where the device collector 18 is released from the top of the shuttle plate fastener 3.

As shown in FIG. 7, the shuttle plate fastener 3 has the second flow path 39 therein, which communicates with the first flow path 182 in the arrangement state. A fluid such as air can pass through the second flow path 39 when the placing part 181 is put under a negative pressure by the negative pressure generator 6. Also, the light LB27 can pass through the second flow path 39 when the IC device 90 is not placed in the placing part 181.

The electronic component tester 1 also has the negative pressure generator 6 putting each placing part 181 under a negative pressure which is lower than the atmospheric pressure. The negative pressure generator 6 is coupled to the second flow path 39 and can apply to the IC device 90 the suction force F2 to suck the IC device 90 placed in the placing part 181, when the negative pressure is generated. The suction force F2 acts in the opposite direction of the suction force F1.

The negative pressure generator 6 has a joint 61 coupled to the second flow path 39, an ejector 62, and a pipe 63 coupling the joint 61 and the ejector 62 together.

In this embodiment, the joint 61 is made up of a bellows-like tube. As the joint 61 is coupled to the second flow path 39, a communicated state from the ejector 62 to the inside of the placing part 181 is achieved. The ejector 62 operates in the communicated state, thus generating the suction force F2 in the placing part 181.

As described above, the driver 5 enables the shuttle plate fastener 3 to move between the first position and the second position, which is different from the first position.

When the shuttle plate fastener 3 is at the first position, the negative pressure generator 6 can put the placing part 181 under the negative pressure to suck the IC device 90 by the function force F2.

Figure 8:
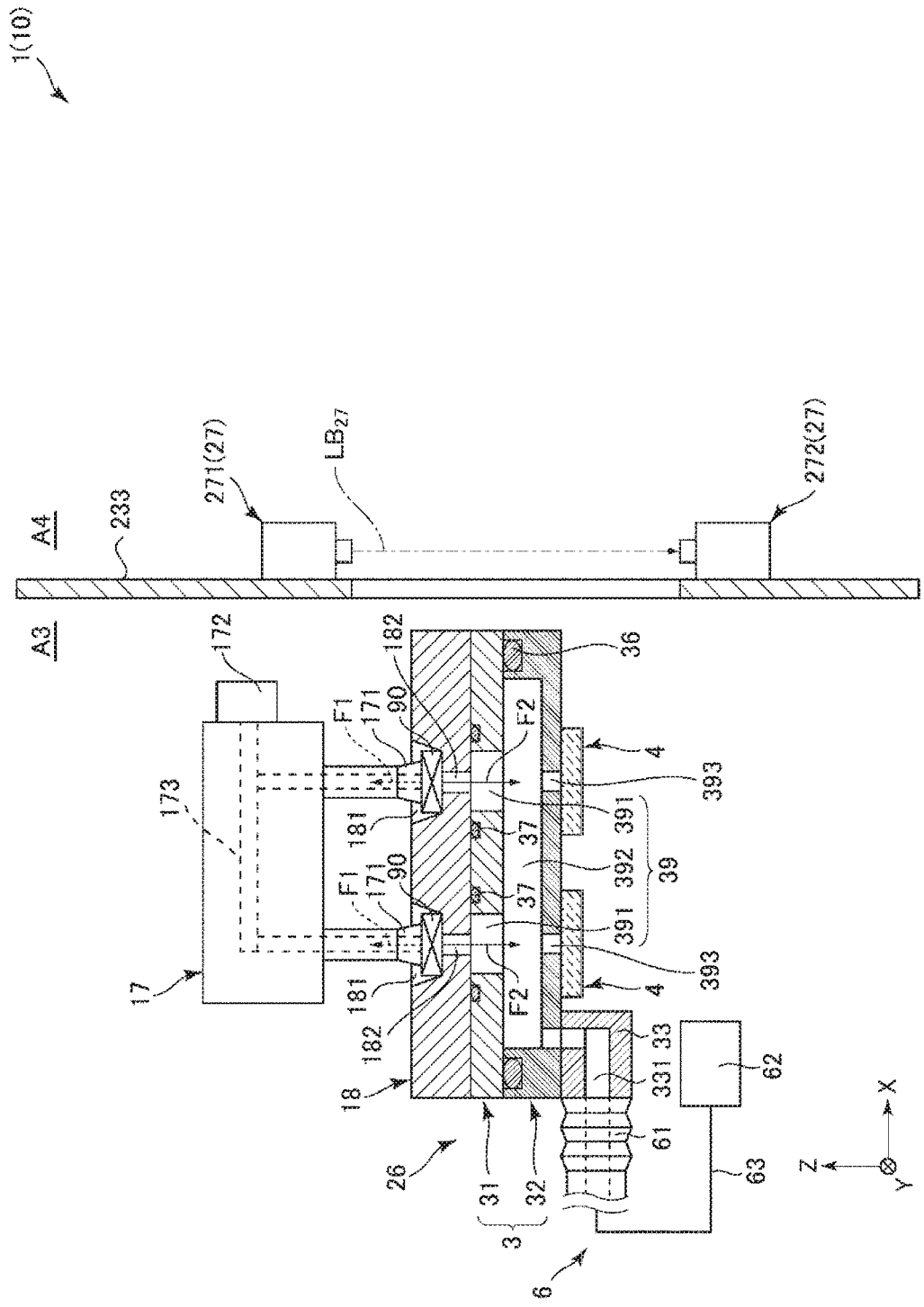
FIG. 8 is a schematic partial vertical cross-sectional view showing, step by step, the process of transporting the IC device from the test area to the collection area in the electronic component tester shown in FIG. 1.

In the states shown in FIGS. 7 and 8, the device collector 18 is at the first position together with the shuttle plate fastener 3. In the process from the state shown in FIG. 7 to the state shown in FIG. 8, the device transport head 17 descends with the holder 171 holding the IC device 90 and places the IC device 90 in the placing part 181 of the device collector 18. In the state shown in FIG. 9, the suction force F1 is canceled, enabling the IC device 90 to be released from the holder 171, as described above. Subsequently, the device transport head 17 can ascend, as shown in FIG. 10.

Incidentally, the cancellation of the suction force F1 may be insufficient, for example, due to deterioration with time of the suction force applier 172 or the like. In this case, the IC device 90 remains sucked to the holder 171. When the device transport head 17 ascends, the IC device 90 may ascend together with the device transport head 17 and may not be placed in the device collector 18.

Figure 9:
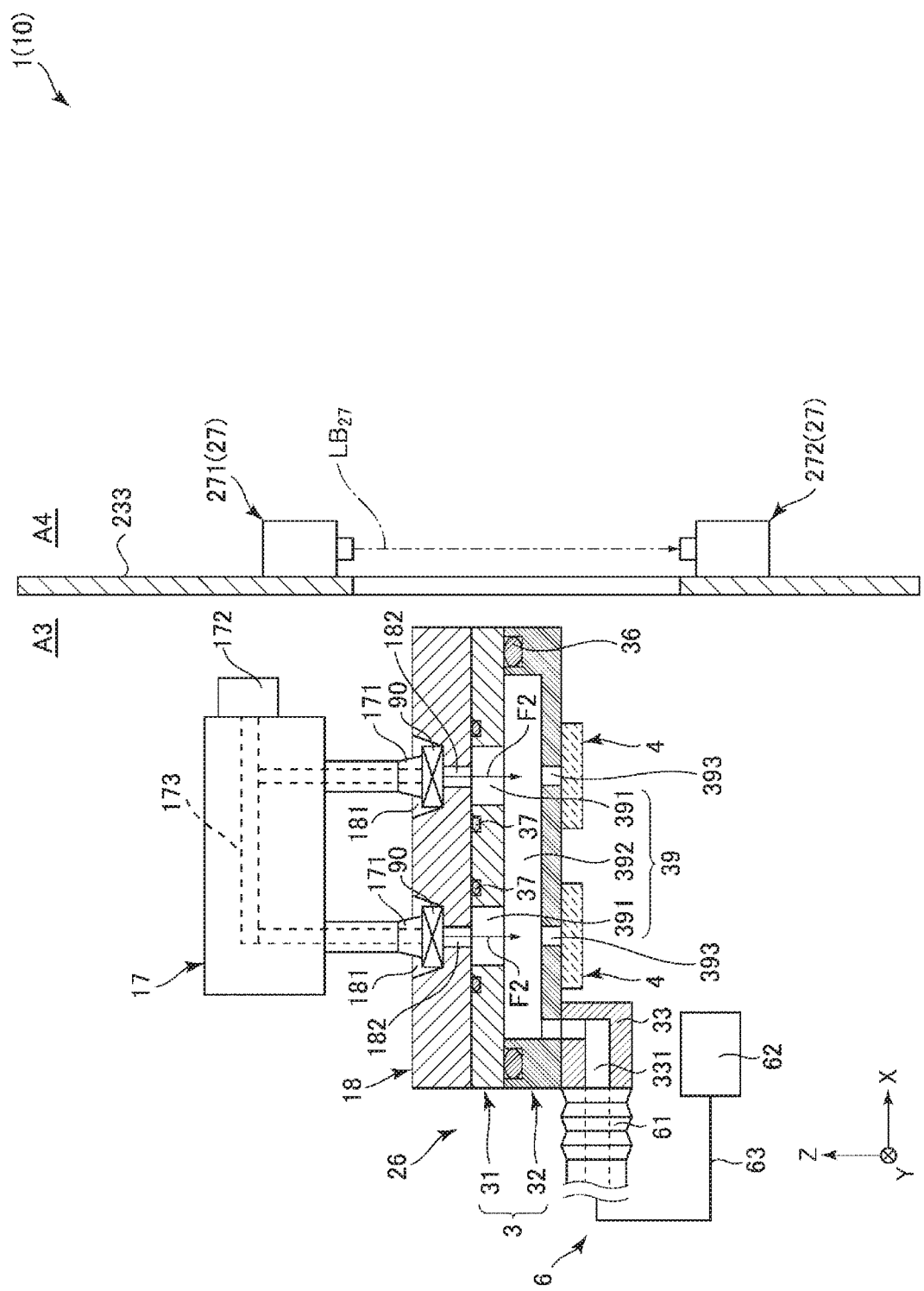
FIG. 9 is a schematic partial vertical cross-sectional view showing, step by step, the process of transporting the IC device from the test area to the collection area in the electronic component tester shown in FIG. 1.
Figure 10:
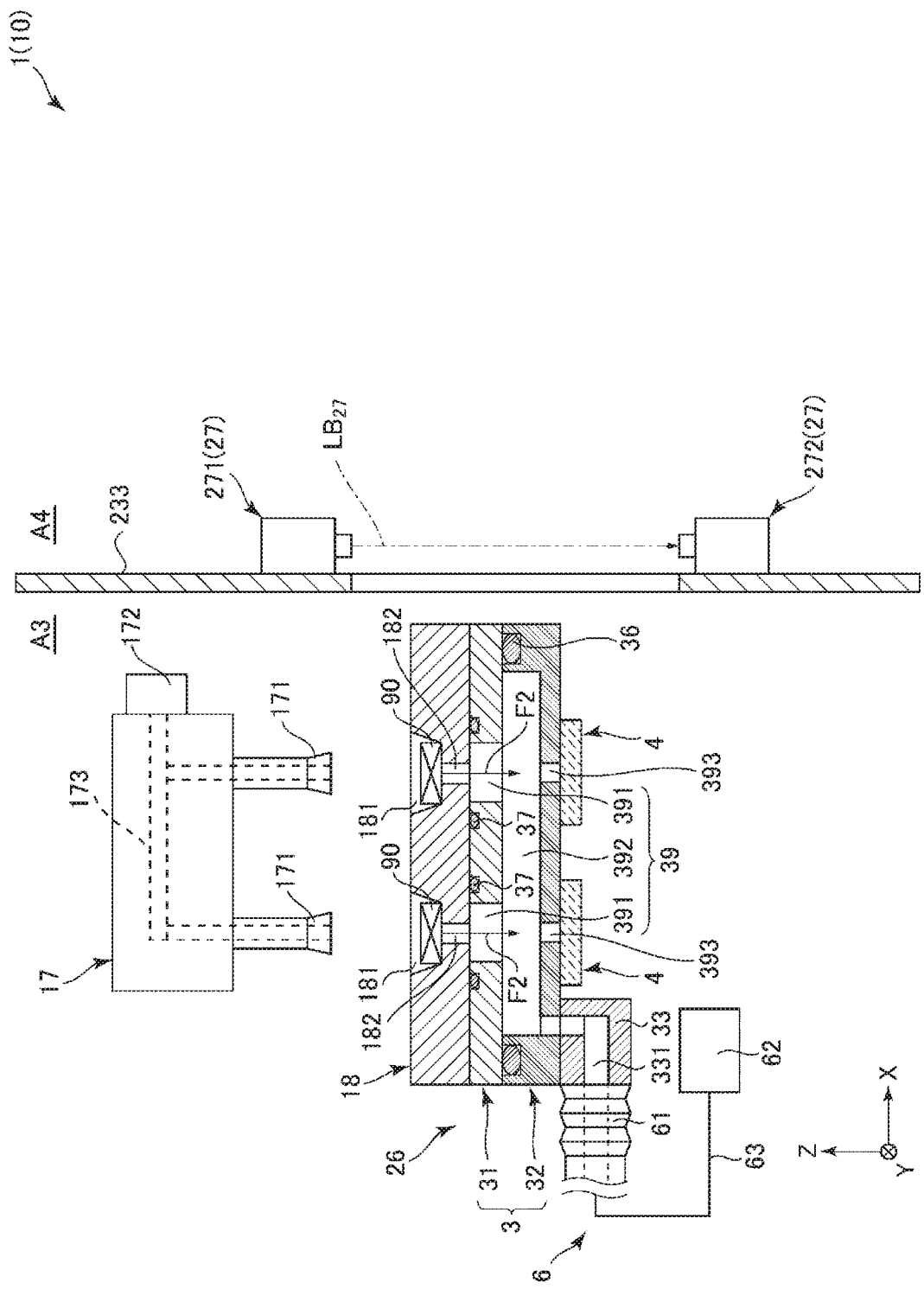
FIG. 10 is a schematic partial vertical cross-sectional view showing, step by step, the process of transporting the IC device from the test area to the collection area in the electronic component tester shown in FIG. 1.

Thus, in the electronic component tester 1, the IC device 90 can be sucked by the suction force F2, as shown in FIG. 9. Thus, even when the cancellation of the suction force F1 is in sufficient as described above, the IC device 90 can be forced off from the holder 171. Therefore, the IC device 90 can be stably placed in the device collector 18.

Preferably, the suction force F2 is greater than the function force F1.

The negative pressure generator 6 is not limited to the configuration shown in FIG. 7 and may have, for example, a pump instead of the ejector 62.

As described above, the device collector 18 has a plurality of first flow paths 182. As shown in FIG. 7, the second flow path 39 has a small flow path 391 individually coupled to each first flow path 182 in the arrangement state, and a large flow path 392 communicating with the respective small flow paths 391 all together. Thus, the respective small flow paths 391 are coupled all together to the negative pressure generator 6 via the large flow path 392. Such a configuration can restrain the number of ejectors 62 installed, for example, compared with a configuration where the large flow path 392 is omitted and where each small flow path 391 is separately coupled to the ejector 62.

The small flow path 391 is formed along the same axis as the first flow path 182 of the device collector 18 in the arrangement state, that is, along the Z-axis. Preferably, the inner diameter of the small flow path 391 is greater than the inner diameter of the first flow path 182.

The large flow path 392 is formed below the small flow path 391. The large flow path 392 has a large enough size to include the respective small flow paths 391 all together, as viewed in a plan view of the shuttle plate fastener 3.

As shown in FIG. 7, the shuttle plate fastener 3 has a first member 31 in which the small flow path 391 is formed, and a second member 32 which is superimposed over and coupled to the first member 31 and in which the large flow path 392 is formed with the first member 31.

Each of the first member 31 and the second member 32 is formed by a plate member. To form the small flow path 391 in the first member 31, a penetration hole to be the small flow path 391 is formed in the plate member as the base member of the first member 31. Thus, the small flow path 391 can be easily formed. To form the large flow path 392 in the second member 32, a recess such as a groove to be the large flow path 392 is formed in the plate member as the base member of the second member 32. Thus, the large flow path 392 can be easily formed. The size of the large flow path 392 can be set without excess or deficiency, according to the number of small flow paths 391, the arrangement thereof, and the like. Thus, the suction force F2 can be generated quickly and sufficiently.

Figure 4:
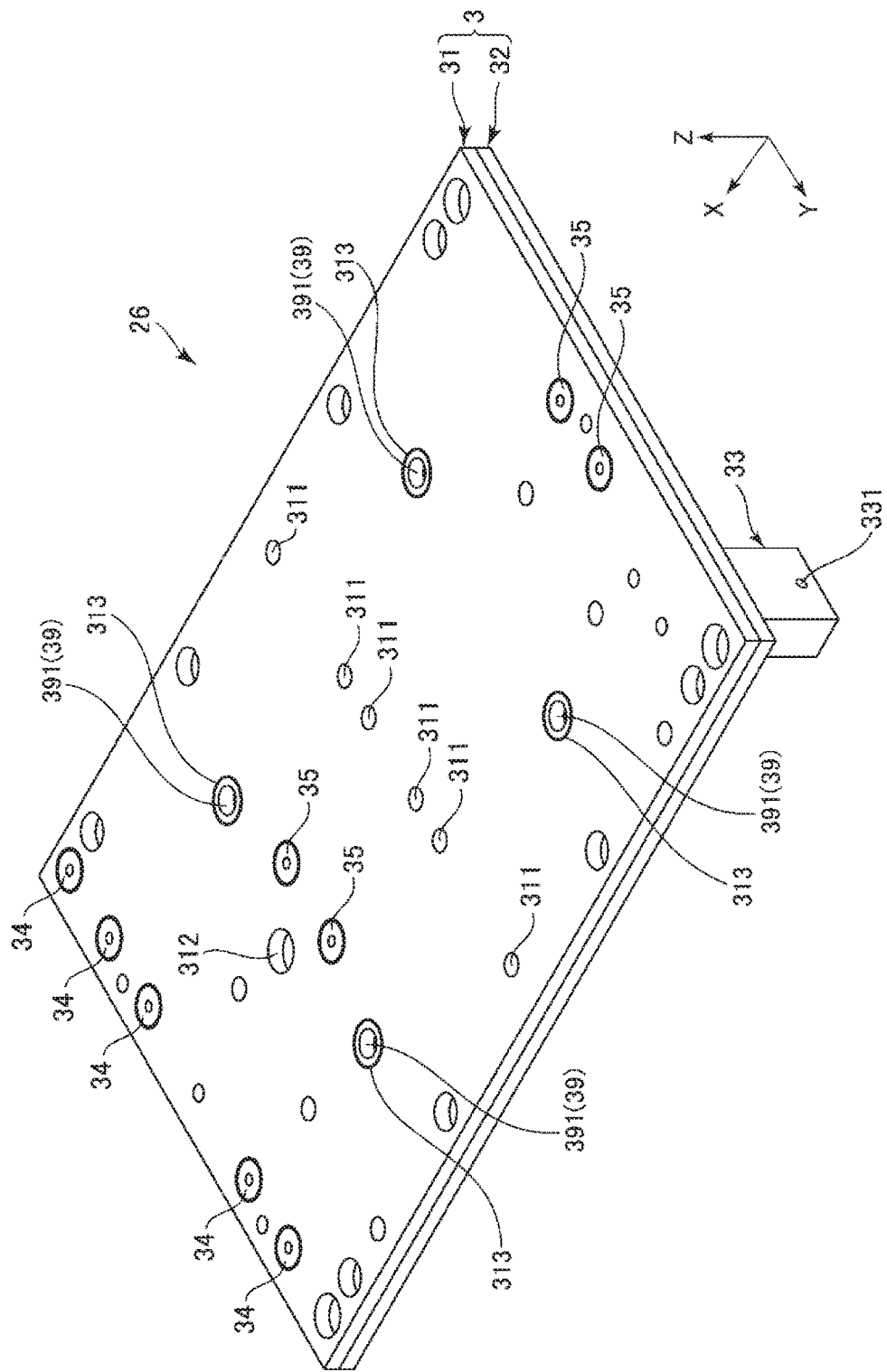
FIG. 4 is a perspective view showing the device collector in FIG. 2.
Figure 5:
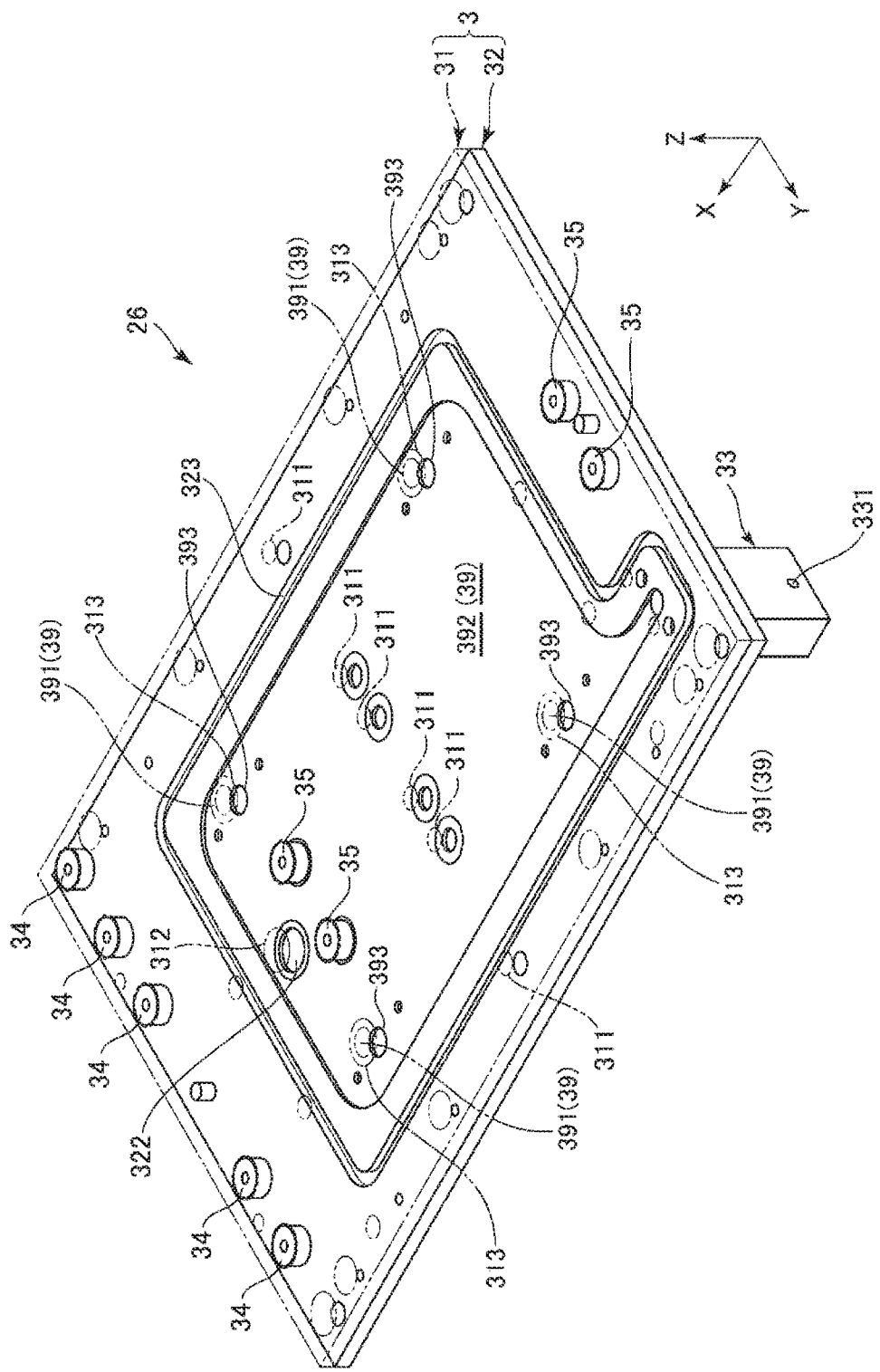
FIG. 5 is a perspective view showing the device collector in FIG. 2.

As shown in FIGS. 4 and 5, the first member 31 and the second member 32 are coupled together via a plurality of bolts 34.

The shuttle plate fastener 3, as a coupled unit made up of the first member 31 and the second member 32 coupled together, is coupled to the base member 51 of the driver 5 via a plurality of bolts 35.

As shown in FIG. 4, in the first member 31, a plurality of female screws 311 meshed with bolts used to fix the device collector 18 is formed. These female screws 311 are spaced apart from each other along the Y-axis. Thus, the female screw 311 used to fix the device collector 18 can be suitably selected according to the type and size of the device collector 18.

In the first member 31, a first lubricant application hole 312 used to apply a lubricant to the slider 522 of the linear guide 52 is formed. Also, as shown in FIG. 5, in the second member 32, a second lubricant application hole 322 communicating with the first lubricant application hole 312 is formed. When applying the lubricant, the slider 522 can be viewed and a nozzle of a lubricant container can be inserted toward the slider 522, via the first lubricant application hole 312 and the second lubricant application hole 322.

The shuttle plate fastener 3 is formed by a coupled unit made up of two plate members superimposed and coupled together, but is not limited to this configuration. For example, the shuttle plate fastener 3 may be formed by a coupled unit made up of three or more plate members superimposed and coupled together. When three or more plate members are used, a method for forming the small flow path 391 and the large flow path 392 and positions where these paths are formed can be selected according to various conditions such as the thickness of each plate member and the way the plate members are superimposed.

The shuttle plate fastener 3 also has a coupling port 33 fixed below the second member 32. The coupling port 33 is formed by a hollow member and its hollow part functions as a coupling flow path 331 coupling together the large flow path 392 of the second flow path 39 and the joint 61 of the negative pressure generator 6. The coupling port 33 may be omitted from the shuttle plate fastener 3. In this case, the large flow path 392 and the joint 61 are directly coupled together.

As shown in FIG. 7, the shuttle plate fastener 3 has a seal member 36 provided between the first member 31 and the second member 32. The seal member 36 is formed by a ring-shaped elastic member. The seal member 36 is installed in such a way that the large flow path 392 is located on the inner side of the seal member 36. This can maintain airtightness between the first member 31 and the second member 32 and therefore can prevent the air within the second flow path 39 from leaking from between these members. Thus, the suction force F2 with a sufficient strength can be generated.

As shown in FIG. 5, in this embodiment, a seal member installation groove 323 is formed on the top side of the second member 32. The seal member 36 can be installed in the seal member installation groove 323. In the seal member installation groove 323, the seal member 36 is compressed between the first member 31 and the second member 32. This improves the airtightness between the first member 31 and the second member 32. The depth of the seal member installation groove 323 is suitably changed when the seal member installation groove 323 is formed, according to the thickness of the seal member 36.

When, for example, the first member 31 is omitted from the shuttle plate fastener 3, the device collector 18 is placed over the second member 32. In this case, the seal member 36 is needed between the device collector 18 and the second member 32. As described above, the device collector 18 is frequently replaced according to the type of the IC device 90. The seal member 36 repeats compression and restoration every time the device collector 18 is replaced, and therefore may easily deteriorate. The seal member 36 that has deteriorated is replaced with a new seal member 36. This replacement may be complicated, depending on the size of the seal member 36.

Meanwhile, in this embodiment, the seal member 36 is protected between the first member 31 and the second member 32 even when the device collector 18 is replaced. This restrains the deterioration of the seal member 36 and therefore can delay the timing of replacing the seal member 36. Also, the time and effort of replacing the seal member 36 can be saved.

As shown in FIG. 7, the shuttle plate fastener 3 has a small seal member 37 provided between the device collector 18 and the first member 31 in the arrangement state. The small seal member 37 is formed by a ring-shaped elastic member smaller than the seal member 36. The small seal member 37 is installed in such a way that the small flow path 391 is located on the inner side of the small seal member 37. This can maintain airtightness between the device collector 18 and the first member 31 and therefore can prevent the air in the second flow path 39 from leaking from between these members. The small seal member 37 may be omitted.

As shown in FIG. 4, in this embodiment, a small seal member installation groove 313 is formed on the top side of the first member 31. The small seal member 37 can be installed in the small seal member installation groove 313. In the small seal member installation groove 313, the small seal member 37 is compressed between the device collector 18 and the first member 31. This improves the airtightness between the device collector 18 and the first member 31. The depth of the small seal member installation groove 313 is suitably changed when the small seal member installation groove 313 is formed, according to the thickness of the small seal member 37.

As shown in FIG. 7, the transmission member 4 is arranged and fixed to the other side of each first flow path 182 from the placing part 181 in the arrangement state, that is, to the bottom side of the second member 32 of the shuttle plate fastener 3. The transmission member 4 is made up of a small piece and seals the second flow path 39. Also, the light LB27 can be transmitted through the transmission member 4.

The material forming the transmission member 4 is not particularly limited. For example, a light-transmissive resin material such as polycarbonate can be used.

Figure 6:
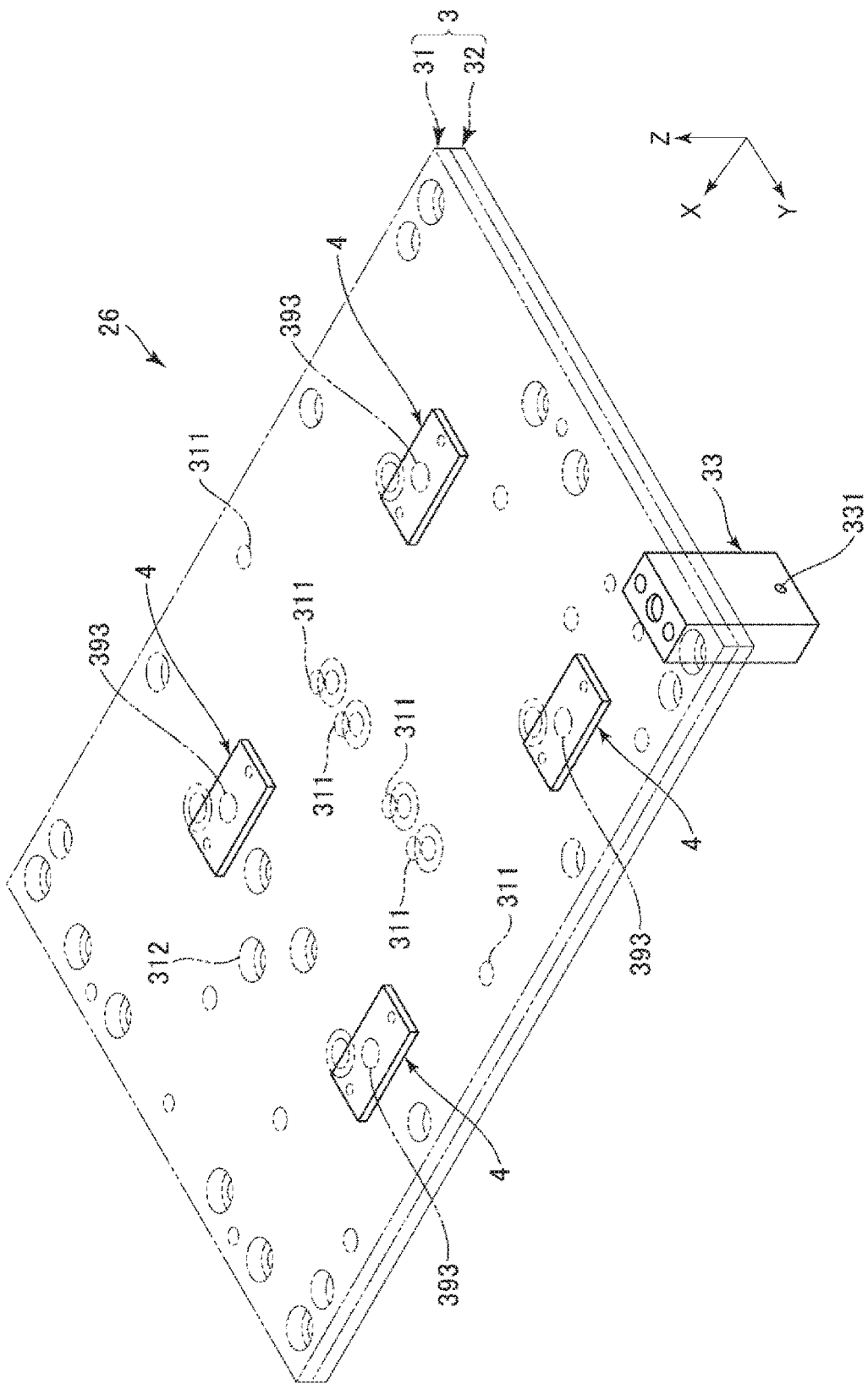
FIG. 6 is a perspective view showing the device collector in FIG. 2.

The large flow path 392 has an opening 393 opening toward each transmission member 4. Each opening 393 is located on an extension line of the first flow path 182. As shown in FIGS. 6 and 7, each transmission member 4 seals the opening 393 from below. The "sealing by the transmission member 4" may be a sealing such that the degree of vacuum in the second flow path 39 is a predetermined level or higher.

Such an arrangement of the transmission member 4 enables the light LB27 to pass through the first flow path 182, the small flow path 391, the large flow path 392, and the opening 393 in order and be transmitted through the transmission member 4, when the IC device 90 is not placed in the placing part 181. In this case, the light LB27 is received by the light receiver 272. Thus, the controller 800 can determine that the IC device 90 is not placed in the placing part 181, as described above.

In this way, in the electronic component tester 1, the first flow path 182 and the second flow path 39 also function as the optical path of the light LB27.

Next, the process of transporting the IC device 90 from the test area A3 to the device collection area A4 will be described with reference to FIGS. 7 to 14.

As shown in FIG. 7, in the test area A3, each holder 171 of the device transport head 17 holds the IC device 90 by the suction force F1. Each holder 171 is located immediately above the placing part 181 of the device collector 18.

The device collector 18 is on standby at the first position. The suction force F2 is generated in each placing part 181.

Next, the device transport head 17 descends, as shown in FIG. 8. The IC device 90 held by each holder 171 is temporarily placed in the placing part 181 of the device collector 18. At this time, the suction force F1 is maintained. The suction force F2 acts on the IC device 90 in each placing part 181. Thus, the IC device 90 is forced toward the placing part 181.

Next, a vacuum break by the suction force applier 172 cancels the suction force F1, as shown in FIG. 9. Thus, the IC device 90 is released from each holder 171.

Next, the device transport head 17 ascends, as shown in FIG. 10. At this time, the IC device 90 can be forced off from the holder 171 by the suction force F2 even when the cancellation of the suction force F1 is insufficient, as described above. Thus, the IC device 90 is prevented from ascending together with the device transport head 17 and is therefore placed in the placing part 181.

Figure 11:
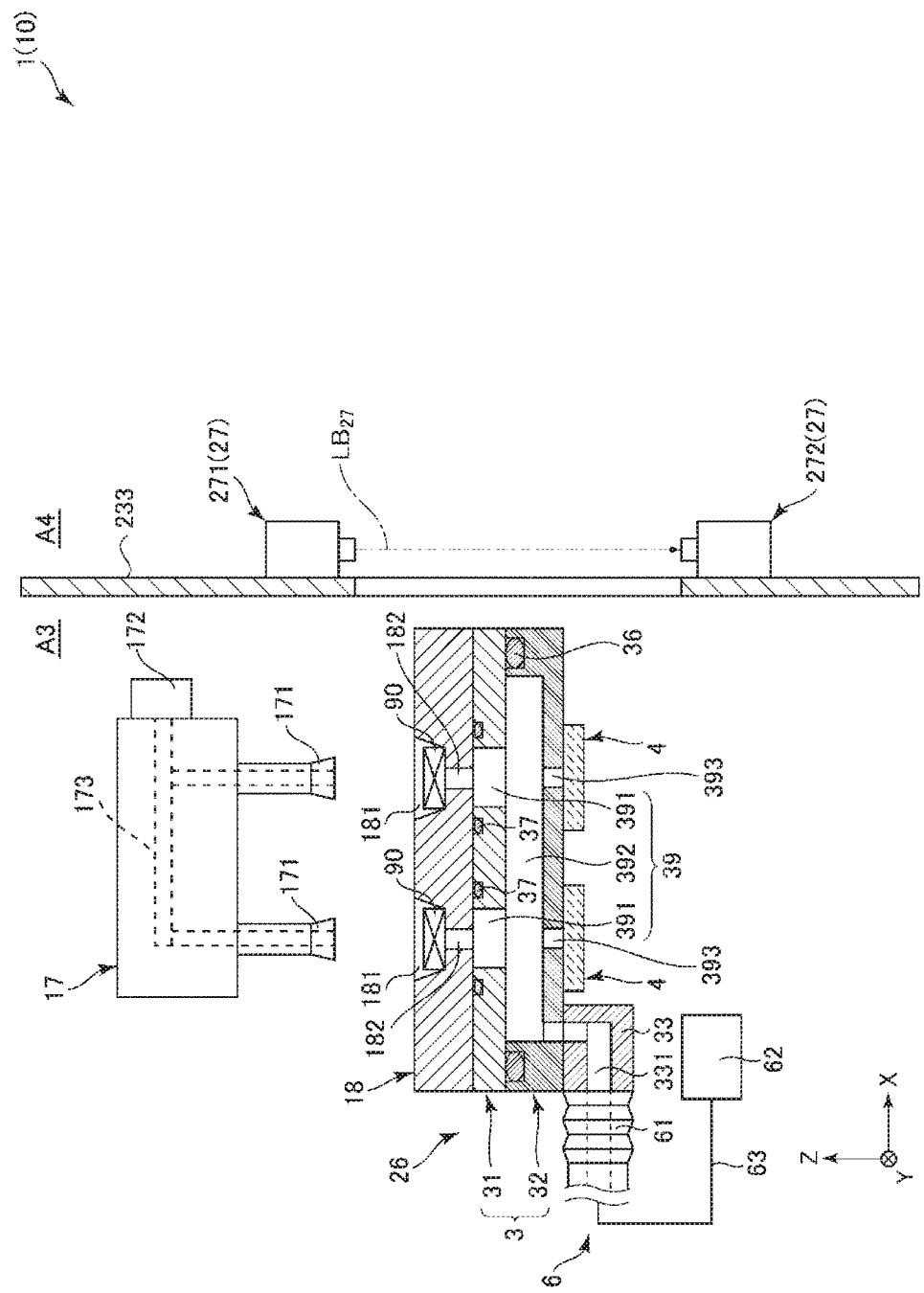
FIG. 11 is a schematic partial vertical cross-sectional view showing, step by step, the process of transporting the IC device from the test area to the collection area in the electronic component tester shown in FIG. 1.

Next, a vacuum break by the ejector 62 cancels the suction force F2, as shown in FIG. 11. The suction force F2 may be canceled because each IC device 90 is already placed in the placing part 181.

Next, the operation of the electronic component transporter 26 moves the device collector 18 into the device collection area A4, as shown in FIGS. 12 and 13 in order. Thus, the IC device 90 can be transported together with the device collector 18.

In FIG. 12, when the IC device 90 on the positive side of the X-axis passes between the light irradiator 271 and the light receiver 272, the IC device 90 blocks the light LB27. Thus, it is detected that the IC device 90 is placed in the placing part 181 on the positive side of the X-axis.

Similarly, in FIG. 13, when the IC device 90 on the negative side of the X-axis passes between the light irradiator 271 and the light receiver 272, the IC device 90 blocks the light LB27. Thus, it is detected that the IC device 90 is placed in the placing part 181 on the negative side of the X-axis.

When the ejector 62 has deteriorated with time, the action of the suction force F2 on the IC device 90 may be insufficient. In this case, due to the insufficient cancellation of the suction force F1 as well, the IC device 90 may be sucked to the holder 171 and ascend together with the device transport head 17. Consequently, the IC device 90 is not placed in the placing part 181.

Thus, the presence/absence of the IC device 90 can be detected when the device collector 18 passes between the light irradiator 271 and the light receiver 272. When the IC device 90 is not present in the placing part 181 where the IC device 90 should be present, for example, an alarm can go off from the speaker 500 to report that. In this way, in the electronic component tester 1, after the IC device 90 is placed, the presence/absence of the IC device 90 in the device collector 18 can be accurately detected.

Figure 14:
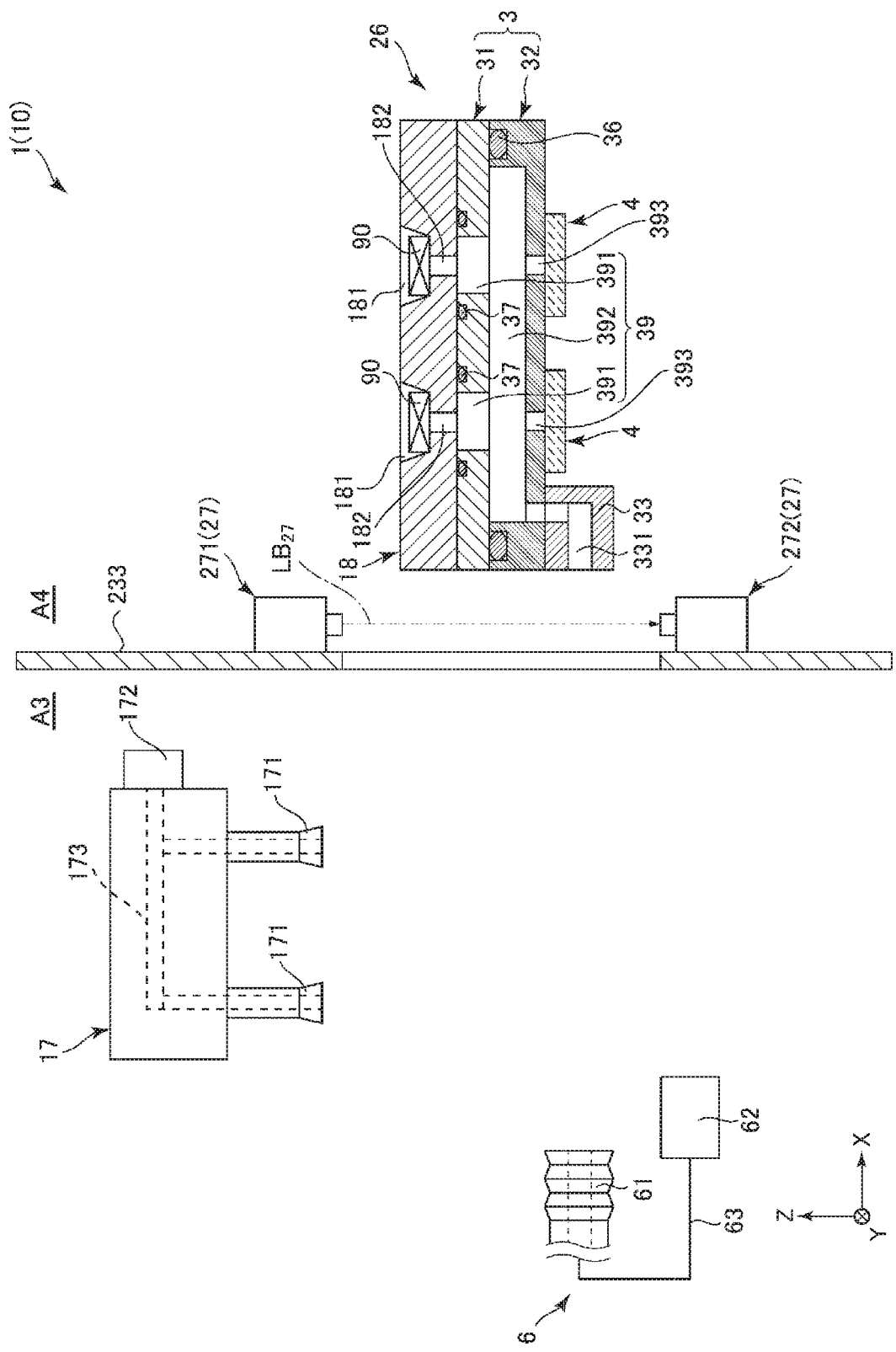
FIG. 14 is a schematic partial vertical cross-sectional view showing, step by step, the process of transporting the IC device from the test area to the collection area in the electronic component tester shown in FIG. 1.

After the state shown in FIG. 13, the device collector 18 stops at the second position, as shown in FIG. 14. This completes the transport of the IC device 90 from the test area A3 to the device collection area A4.

As described above, in the electronic component tester 1 having the electronic component handler 10, the device transport head 17 has the holder 171 holding the IC device 90 by suction and placing the IC device 90 in the placing part 181, and the suction force applier 172 generating the suction force F1 to suck the IC device 90 at the holder 171.

As shown in FIGS. 7 to 9, from the start to completion of the placing of the IC device 90 in the placing part 181 by the holder 171, the negative pressure generator 6 puts the placing part 181 under the negative pressure and applies the suction force F2 to the IC device 90. Thus, the IC device 90 can be forced toward the placing part 181. The time point when the placing starts is the time point when the holder 171 is located immediately above the placing part 181 of the device collector 18. However, this is not limiting. For example, the time point when the placing starts may be the time point when the holder 171 is located further above the position immediately above the placing part 181 of the device collector 18.

As shown in FIG. 9, the suction force applier 172 can cancel the suction force F1 while the negative pressure generator 6 is putting the placing part 181 under the negative pressure, that is, while the suction force F2 is acting on the IC device 90. Thus, the suction force F1 can be prevented from obstructing the drawing of the IC device 90 toward the placing part 181.

Second Embodiment

Figure 15:
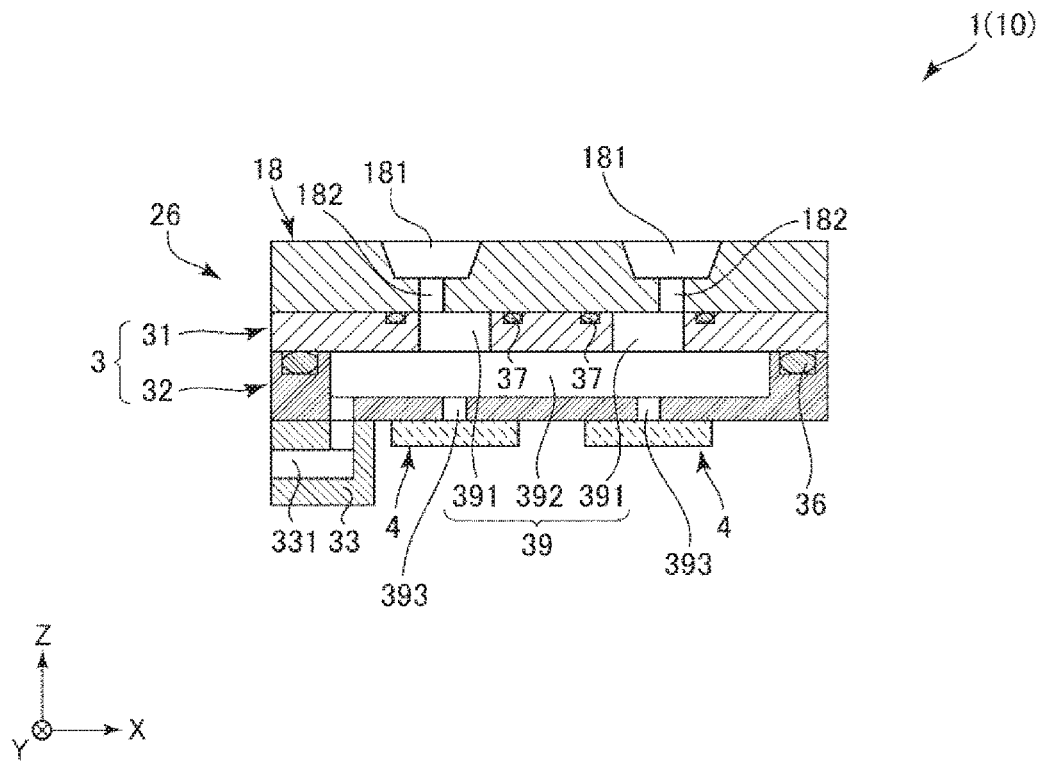
FIG. 15 is a schematic partial vertical cross-sectional view showing the device collector in the electronic component tester (second embodiment) according to the present disclosure.

A second embodiment of the electronic component handler and the electronic component tester according to the present disclosure will now be described with reference to FIG. 15. The following description is mainly about a difference from the foregoing embodiment and omits similar matters.

This embodiment is similar to the first embodiment except that the configuration of the device collector is different.

As described in the first embodiment, the device collector 18 is replaced for every type of the IC device 90. As shown in FIG. 15, in the device collector 18 in this embodiment, the space between the placing parts 181 next to each other along the X-axis is broader than the space (see, for example, FIG. 7) of the placing parts 181 next to each other in the device collector 18 in the first embodiment.

As described above, the inner diameter of the small flow path 391 is greater than the inner diameter of the first flow path 182. Therefore, even when the space between the placing parts 181 is broader, the first flow path 182 and the small flow path 391 can communicate with each other in the arrangement state. Even at this time, airtightness is maintained between the device collector 18 and the shuttle plate fastener 3.

In this way, in this embodiment, even when the device collector 18 is replaced by the device collector 18 having a different space between the placing parts 181, the shuttle plate fastener 3 can be used as it is. Thus, the shuttle plate fastener 3 is highly versatile.

Third Embodiment

A third embodiment of the electronic component handler and the electronic component tester according to the present disclosure will now be described with reference to FIG. 16. The following description is mainly about a difference from the foregoing embodiments and omits similar matters.

This embodiment is similar to the first embodiment except that the configuration of the optical unit is different.

Figure 16:
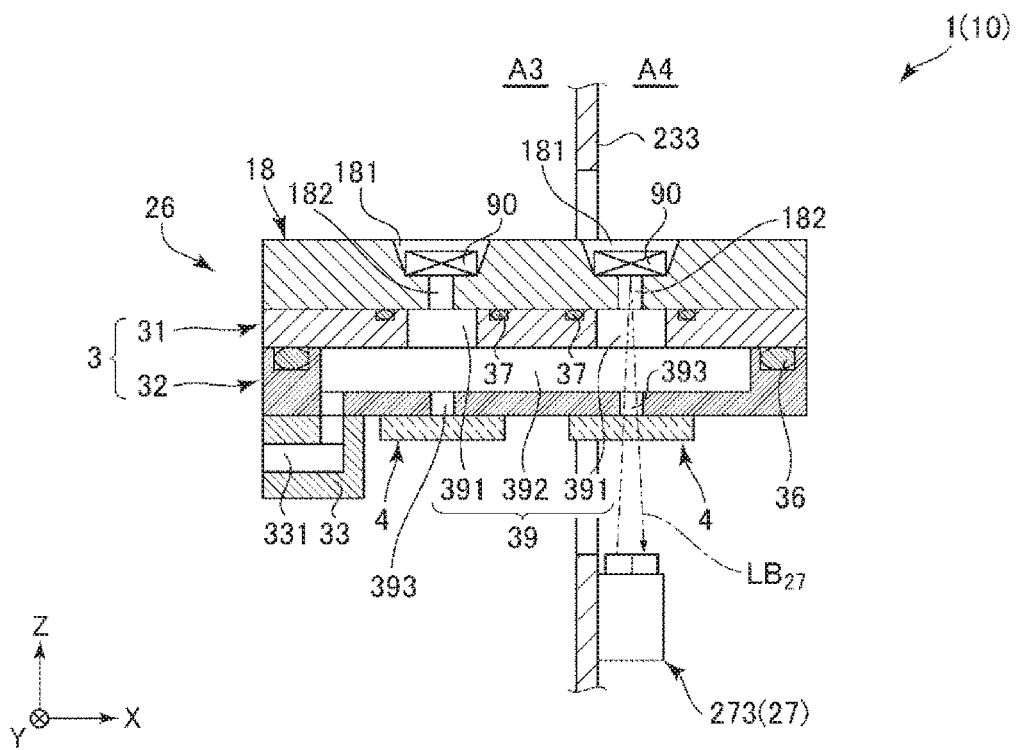
FIG. 16 is a schematic partial vertical cross-sectional view showing a boundary between the test area and the collection area in the electronic component tester (third embodiment) according to the present disclosure.

As shown in FIG. 16, in this embodiment, the optical unit 27 is made up of a reflection-type optical sensor 273. The optical sensor 273 is located below the electronic component transporter 26. When, for example, the IC device 90 is placed in the device collector 18, the light LB27 from the optical sensor 273 is transmitted through the transmission member 4 and passes through the second flow path 39 and the first flow path 182 in order. Subsequently, the light LB27 is reflected off the IC device 90, passes through the reverse route of the foregoing paths, and reaches the optical sensor 273. Meanwhile, when the IC device 90 is not placed in the device collector 18, the light LB27 from the optical sensor 273 is not reflected off the IC device 90 and does not reach the optical sensor 273, either.

Although the optical sensor 273 in the configuration shown in FIG. 16 is arranged on the side of the device collection area A4, this is not limiting. The optical sensor 273 may be arranged at a position that is on the side of the test area A3 and that does not interfere with the device transport head 17. When the optical sensor 273 is arranged on the side of the test area A3, the presence/absence of the IC device 90 in the device collector 18 can be detected by the optical sensor 273, at the same time when or immediately after the IC device 90 is drawn to the device collector 18.

Fourth Embodiment

A fourth embodiment of the electronic component handler and the electronic component tester according to the present disclosure will now be described with reference to FIG. 17. The following description is mainly about a difference from the foregoing embodiments and omits similar matters.

This embodiment is similar to the first embodiment except that the configuration of the electronic component transporter is different.

As described in the first embodiment, the shuttle plate fastener 3 of the electronic component transporter 26 takes the arrangement state, and the removal state, where the device collector 18 in the arrangement state is removed.

Figure 17:
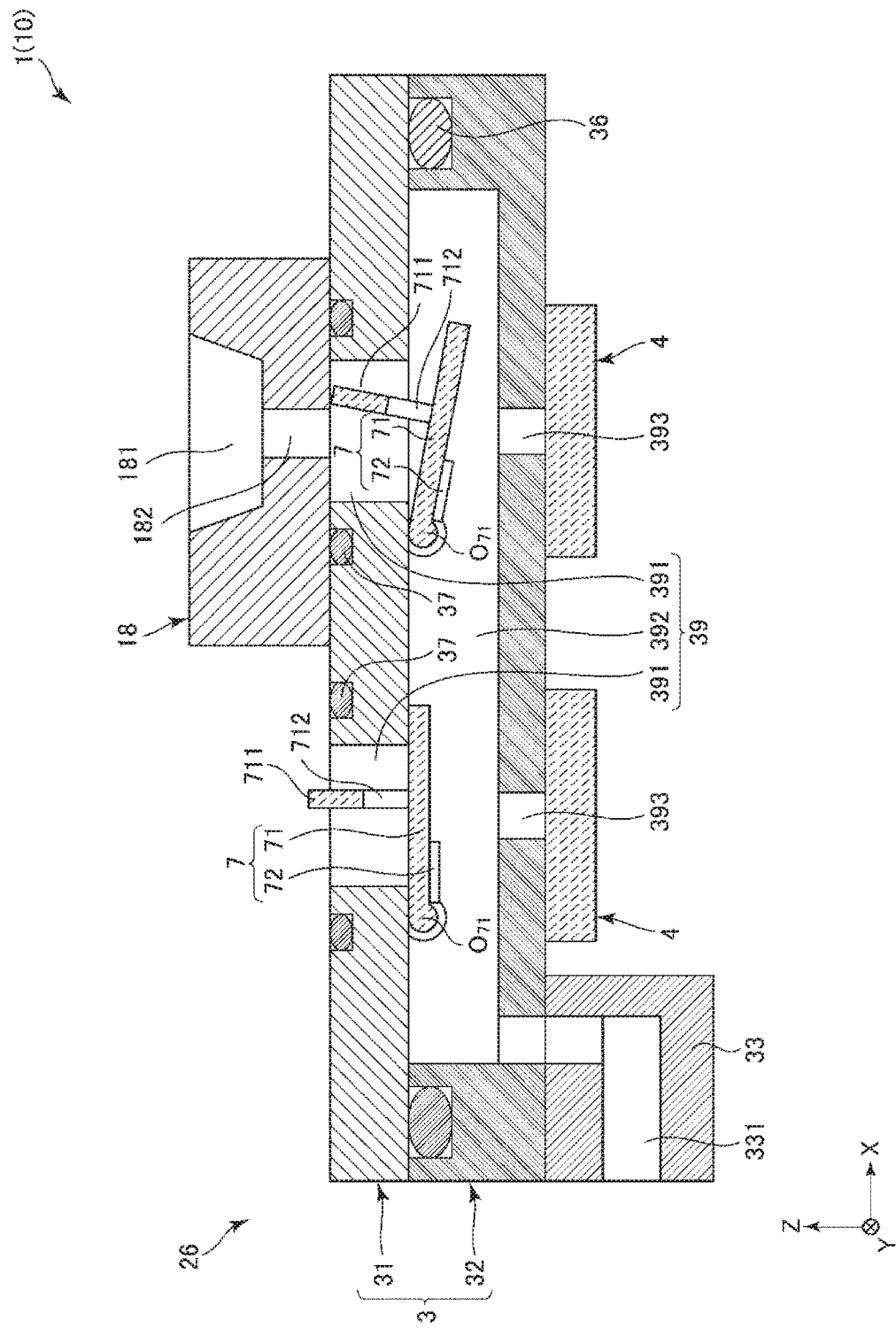
FIG. 17 is a schematic partial vertical cross-sectional view showing the device collector in the electronic component tester (fourth embodiment) according to the present disclosure.

As shown in FIG. 17, the electronic component transporter 26 has a changeover part 7 allowing communication between the first flow path 182 and the second flow path 39. The changeover part 7 is has a lid member 71 (lid) arranged between the small flow path 391 and the large flow path 392 of the shuttle plate fastener 3 and changing the communication between the small flow path 391 and the large flow path 392. The lid member 71 is supported in such a way as to be able to pivot on the lower side of the first member 31 of the shuttle plate fastener 3. The changeover part 7 also has an energizing member 72 energizing the lid member 71. The changeover part 7 is configured in such a way that only the part where the device collector 18 is arranged is opened.

The lid member 71 can pivot about a pivotal axis O71 provided in the energizing member 72 and thus approach and move away from the small flow path 391. The outer diameter of the lid member 71 is greater than the inner diameter of the small flow path 391. Therefore, in the state of approaching the small flow path 391, the lid member 71 can close the small flow path 391. Thus, the first flow path 182 and the second flow path 39 are cut off from each other. Meanwhile, in the state of moving away from the small flow path 391, the lid member 71 can open the small flow path 391. Thus, the first flow path 182 and the second flow path 39 communicate with each other. The light from the light irradiator 271 can pass through the lid member 71. For example, a light-transmissive resin material or the like such as polycarbonate may be used as the material forming the lid member 71, similarly to the transmission member 4.

The lid member 71 also has a protrusion 711 protruding upward. A penetration hole 712 is formed in the protrusion 711.

The energizing member 72 can energize the lid member 71 in a direction in which the lid member 71 approaches the small flow path 391. Although the energizing member 72 in the configuration shown in FIG. 17 is made up of a torsion spring, this is not limiting. For example, the energizing member 72 may be made up of a compression coil spring and provided below the lid member 71. In this case, the energizing member 72 is compressed between the lid member 71 and the second member 32 and energizes the lid member 71 by its reaction force. Although the energizing member 72 in the configuration shown in FIG. 17 is configured to have the pivotal axis O71, this is not limiting. For example, a hinge having the pivotal axis O71 may be provided as a separate member from the energizing member 72. For example, a cylindrical pivot part to be the pivotal axis O71 may be formed in the lid member 71, and a plate engaged with the pivot part in such a way as to be able to pivot may be fixed to the lower side of the first member 31, thus forming a hinge.

The configuration as described above enables the device collector 18 in the arrangement state to press the protrusion 711 against the energizing force of the energizing member 72 and move the lid member 71 away from the small flow path 391. Thus, the first flow path 182 and the second flow path 39 communicate with each other, thus allowing the suction force F2 to be generated in the placing part 181.

Depending on the type of the device collector 18, even when in the arrangement state, the protrusion 711 may not be pressed and the state where the lid member 71 closes the small flow path 391 may be maintained, like the changeover part 7 on the left side in FIG. 17. When the small flow path 391 is not used as in this case, the changeover part 7 can prevent, for example, dust and particles or the like in the atmosphere from entering the second flow path 39. Thus, the second flow path 39 can be prevented from being clogged.

Although the lid member 71 in the configuration shown in FIG. 17 is formed as a single member, this is not limiting. For example, the lid member 71 may be formed as a plurality of lid members so that a first lid member and a second lid member close the small flow path 391. The first lid member has a first protrusion and the first energizing member. The second lid member has a second protrusion and a second energizing member. In this case, the device collector 18 presses the first protrusion and the second protrusion and thus moves the first lid member and the second lid member away from the small flow path 391. Thus, even without using a light-transmissive resin material or the like for the first lid member and the second lid member, light can pass through the lid member when the lid member moves away.

The lid member 71 is not limited to the configuration having the protrusion 711. For example, a protrusion protruding downward may be provided on the device collector 18. In this case, the protrusion presses the lid member 71 via the small flow path 391 and moves the lid member 71 away from the small flow path 391.

The changeover part 7 is not limited to the configuration having the energizing member 72. For example, the changeover part 7 may be a slide open/close door which opens and closes the lid member 71 by sliding along a slide rail, or a revolving door which pivots the lid member 71 to the left and right and thus opens and closes. Also, the lid member 71 can be manually opened and closed without providing the energizing member 72. In any case, the changeover part 7 may have a lid which changes over the communication between the small flow path 391 and the large flow path 392.

Fifth Embodiment

A fifth embodiment of the electronic component handler and the electronic component tester according to the present disclosure will now be described with reference to FIG. 18. The following description is mainly about a difference from the foregoing embodiments and omits similar matters.

This embodiment is similar to the first embodiment except that the configuration of the shuttle plate fastener is different.

Figure 18:
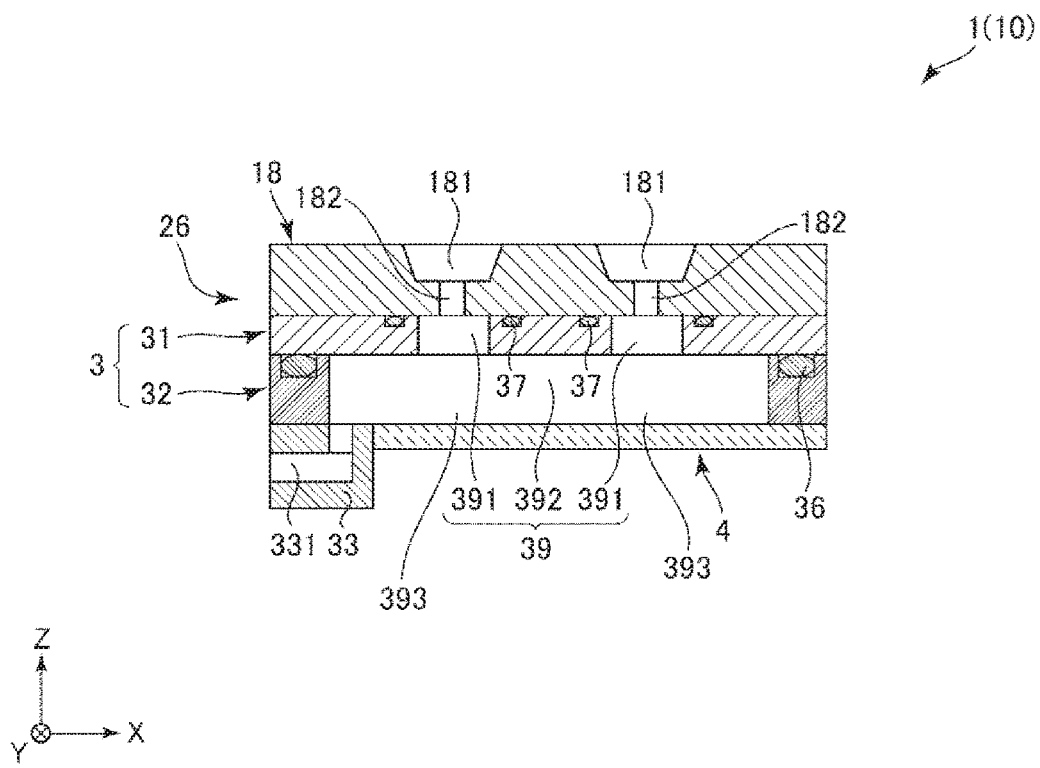
FIG. 18 is a schematic partial vertical cross-sectional view showing the device collector in the electronic component tester (fifth embodiment) according to the present disclosure.

As shown in FIG. 18, in this embodiment, the large flow path 392 of the shuttle plate fastener 3 is not provided with the opening 393. The entirety of the large flow path 392 is formed, penetrating the second member 32. In this case, the transmission member 4 is a single member and covers and seals the second member 32 from below. This can restrain the number of transmission members 4 arranged and can simplify the configuration of the electronic component transporter 26.

Sixth Embodiment

A sixth embodiment of the electronic component handler and the electronic component tester according to the present disclosure will now be described with reference to FIG. 19. The following description is mainly about a difference from the foregoing embodiments and omits similar matters.

This embodiment is similar to the first embodiment except that the configuration of the device collector is different.

Figure 19:
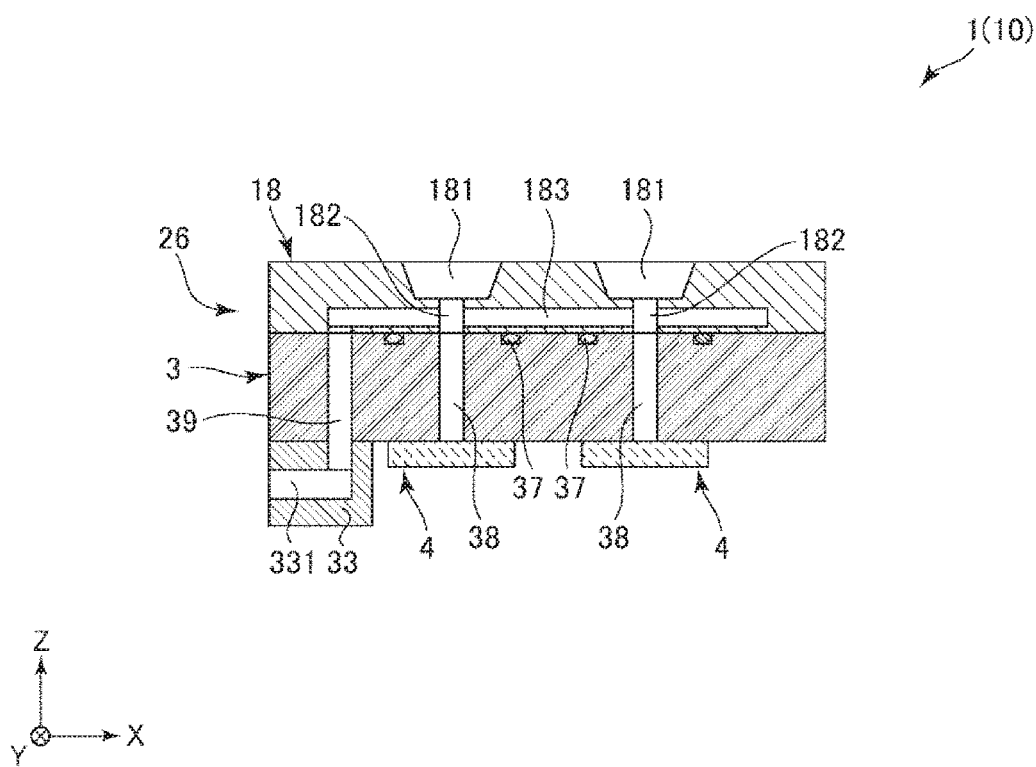
FIG. 19 is a schematic partial vertical cross-sectional view showing the device collector in the electronic component tester (sixth embodiment) according to the present disclosure.

As shown in FIG. 19, in this embodiment, the device collector 18 has a relay flow path 183 communicating with the respective first flow paths 182 all together. In the arrangement state, the relay flow path 183 can communicate with the coupling flow path 331 of the coupling port 33 via the second flow path 39 of the shuttle plate fastener 3. Thus, when the shuttle plate fastener 3 is at the first position, the suction force F2 is generated in each placing part 181 of the device collector 18 and the IC device 90 can be sucked therein.

In the shuttle plate fastener 3, a penetration hole 38 communicating with the first flow path 182 in the arrangement state and functioning as the optical path of the light LB27 is formed separately from the second flow path 39. The penetration hole 38 is sealed on the lower side by the transmission member 4.

The electronic component handler and the electronic component tester according to the present disclosure have been described above, based on the illustrated embodiments. However, the present disclosure is not limited to these embodiments. Each part forming the electronic component handler and the electronic component tester can be replaced with an arbitrary configuration that can achieve a similar function. Also, an arbitrary configuration may be added.

The electronic component handler and the electronic component tester according to the present disclosure may be a combination of two or more arbitrary configurations (features) of the respective embodiments.

What is claimed is:

1. An electronic component handler comprising: an electronic component transporter transporting an electronic component in an arrangement state where a shuttle plate is arranged, the shuttle plate having a recess where the electronic component is placed; a light source casting light onto the recess; a light receiver receiving the light and outputting a signal; a detector detecting presence/absence of the electronic component placed in the recess, based on the signal; and a negative pressure generator putting the recess under a lower pressure than an atmospheric pressure, wherein the shuttle plate has a first flow path, the first flow path is a flow path which opens in the recess and where a fluid and the light pass, the electronic component transporter has a shuttle plate fastener, a transmission member, and a driver, the shuttle plate fastener has a second flow path, and has the shuttle plate fixed thereto in the arrangement state, the second flow path is a flow path where the fluid and the light pass and which communicates with the first flow path and is coupled to the negative pressure generator in the arrangement state, the transmission member is provided in the shuttle plate fastener, seals the second flow path, and transmits the light, the driver drives the shuttle plate fastener, and the negative pressure generator sucks the electronic component to the recess.

2. The electronic component handler according to claim 1, wherein the shuttle plate fastener moves between a first position and a second position which is different from the first position, and the negative pressure generator puts the recess under a lower pressure than the atmospheric pressure when the shuttle plate fastener is located at the first position.

3. The electronic component handler according to claim 2, wherein the light source and the light receiver are arranged between the first position and the second position, and the detector detects the presence/absence of the electronic component when the shuttle plate fastener moves from the first position to the second position.

4. The electronic component handler according to claim 1, wherein the shuttle plate has the first flow path in a plural number, and the second flow path has small flow paths individually coupled to the respective first flow paths in the arrangement state, and a large flow path communicating with the respective small flow paths all together.

5. The electronic component handler according to claim 4, wherein the shuttle plate fastener has a first member having the small flow paths formed therein, and a second member superimposed over and coupled to the first member and forming the large flow path together with the first member.

6. The electronic component handler according to claim 5, wherein the large flow path has an opening opened toward the transmission member, and the transmission member seals the opening.

7. The electronic component handler according to claim 5, wherein the shuttle plate fastener has a seal member provided between the first member and the second member.

8. The electronic component handler according to claim 5, wherein the electronic component transporter has a changeover part allowing communication between the first flow path and the second flow path, and the changeover part has a lid arranged between the small flow paths and the large flow path of the shuttle plate fastener and changing over communication between the small flow paths and the large flow path.

9. The electronic component handler according to claim 1, further comprising a holder holding the electronic component by suction and placing the electronic component in the recess, and a suction force applier generating a suction force to suck the electronic component, at the holder, wherein the negative pressure generator puts the recess under a lower pressure than the atmospheric pressure from start to completion of the placing of the electronic component in the recess by the holder, and the suction force applier cancels the suction force while the recess is put under the lower pressure than the atmospheric pressure by the negative pressure generator.

10. An electronic component tester comprising: an electronic component transporter transporting an electronic component in an arrangement state where a shuttle plate is arranged, the shuttle plate having a recess where the electronic component is placed; a light source casting light onto the recess; a light receiver receiving the light and outputting a signal; a detector detecting presence/absence of the electronic component placed in the recess, based on the signal; a negative pressure generator putting the recess under a lower pressure than an atmospheric pressure; and a tester testing the electronic component, wherein the shuttle plate has a first flow path, the first flow path is a flow path which opens in the recess and where a fluid and the light pass, the electronic component transporter has a shuttle plate fastener, a transmission member, and a driver, the shuttle plate fastener has a second flow path, and has the shuttle plate fixed thereto in the arrangement state, the second flow path is a flow path where the fluid and the light pass and which communicates with the first flow path and is coupled to the negative pressure generator in the arrangement state, the transmission member is provided in the shuttle plate fastener, seals the second flow path, and transmits the light, the driver drives the shuttle plate fastener, and the negative pressure generator sucks the electronic component to the recess.

\* \* \* \* \*